(12) United States Patent
Kim et al.

(10) Patent No.: US 11,756,968 B2
(45) Date of Patent: Sep. 12, 2023

(54) IMAGE SENSOR DEVICE

(71) Applicant: SAMSUNG ELECTRONICS CO., LTD., Suwon-si (KR)

(72) Inventors: Seoksan Kim, Suwon-si (KR); Minwoong Seo, Hwaseong-si (KR); Myunglae Chu, Hwaseong-si (KR); Jong-Yeon Lee, Seoul (KR); Min-Jun Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 368 days.

(21) Appl. No.: 16/882,597

(22) Filed: May 25, 2020

(65) Prior Publication Data

US 2021/0091129 A1    Mar. 25, 2021

(30) Foreign Application Priority Data

Sep. 24, 2019    (KR) .................. 10-2019-0117504

(51) Int. Cl.
*H01L 27/14*    (2006.01)
*H01L 27/146*    (2006.01)
*H04N 25/77*    (2023.01)

(52) U.S. Cl.
CPC ....... *H01L 27/14605* (2013.01); *H04N 25/77* (2023.01)

(58) Field of Classification Search
CPC ......... H01L 27/14605; H01L 27/14609; H01L 27/14636; H01L 27/14634; H01L 27/14641; H04N 5/3745; H04N 5/3355; H04N 5/3575; H04N 5/378; H04N 5/379; H04N 5/37455; H04N 5/369
See application file for complete search history.

(56) References Cited

U.S. PATENT DOCUMENTS

| | | |
|---|---|---|
| 7,244,918 B2 | 7/2007 | Mckee et al. |
| 7,924,333 B2 | 4/2011 | Yin et al. |
| 8,729,448 B1 | 5/2014 | Wood |

(Continued)

OTHER PUBLICATIONS

Mizuno et al., "High Performance Digital Read Out Integrated Circuit(DROIC) for Infrared Imaging", Proc. of SPIE vol. 9854, 2016, pp. 985409-1-985409-7.

(Continued)

*Primary Examiner* — Tony Ko
(74) *Attorney, Agent, or Firm* — F. CHAU & ASSOCIATES, LLC

(57) ABSTRACT

An image sensor device including: a first digital pixel including a first photodetector and first memory cells to store a first digital signal corresponding to a first output from the first photodetector; and a second digital pixel including a second photodetector and second memory cells to store a second digital signal corresponding to a second output from the second photodetector, the second digital pixel is adjacent to one side of the first digital pixel, the first memory cells and the second memory cells are connected with a plurality of bit lines, the first memory cells are connected with a first word line and a third word line, the second memory cells are connected with a second word line and a fourth word line, the second word line is between the first and third word lines, and the third word line is between the second and fourth word lines.

22 Claims, 30 Drawing Sheets

(56) References Cited

U.S. PATENT DOCUMENTS

| | | |
|---|---|---|
| 8,773,562 B1 | 7/2014 | Fan |
| 9,654,713 B2 | 5/2017 | Hynecek et al. |
| 9,911,781 B2 | 3/2018 | Haddad et al. |
| 9,972,652 B2 | 5/2018 | Sargent et al. |
| 9,986,181 B2 | 5/2018 | Yao et al. |
| 10,021,331 B2 | 7/2018 | Sakakibara et al. |
| 10,182,198 B2 | 1/2019 | Nishihara |
| 11,004,881 B2 * | 5/2021 | Liu .................... H04N 5/37452 |
| 2001/0009440 A1 | 7/2001 | Yang et al. |
| 2007/0127306 A1 | 6/2007 | Sung et al. |
| 2010/0276572 A1 | 11/2010 | Iwabuchi et al. |
| 2016/0163686 A1 | 6/2016 | Lee et al. |
| 2018/0204867 A1 | 7/2018 | Kim et al. |

OTHER PUBLICATIONS

Examination report dated Nov. 10. 2020 in corresponding European Patent Application No. 20196076.2.

\* cited by examiner

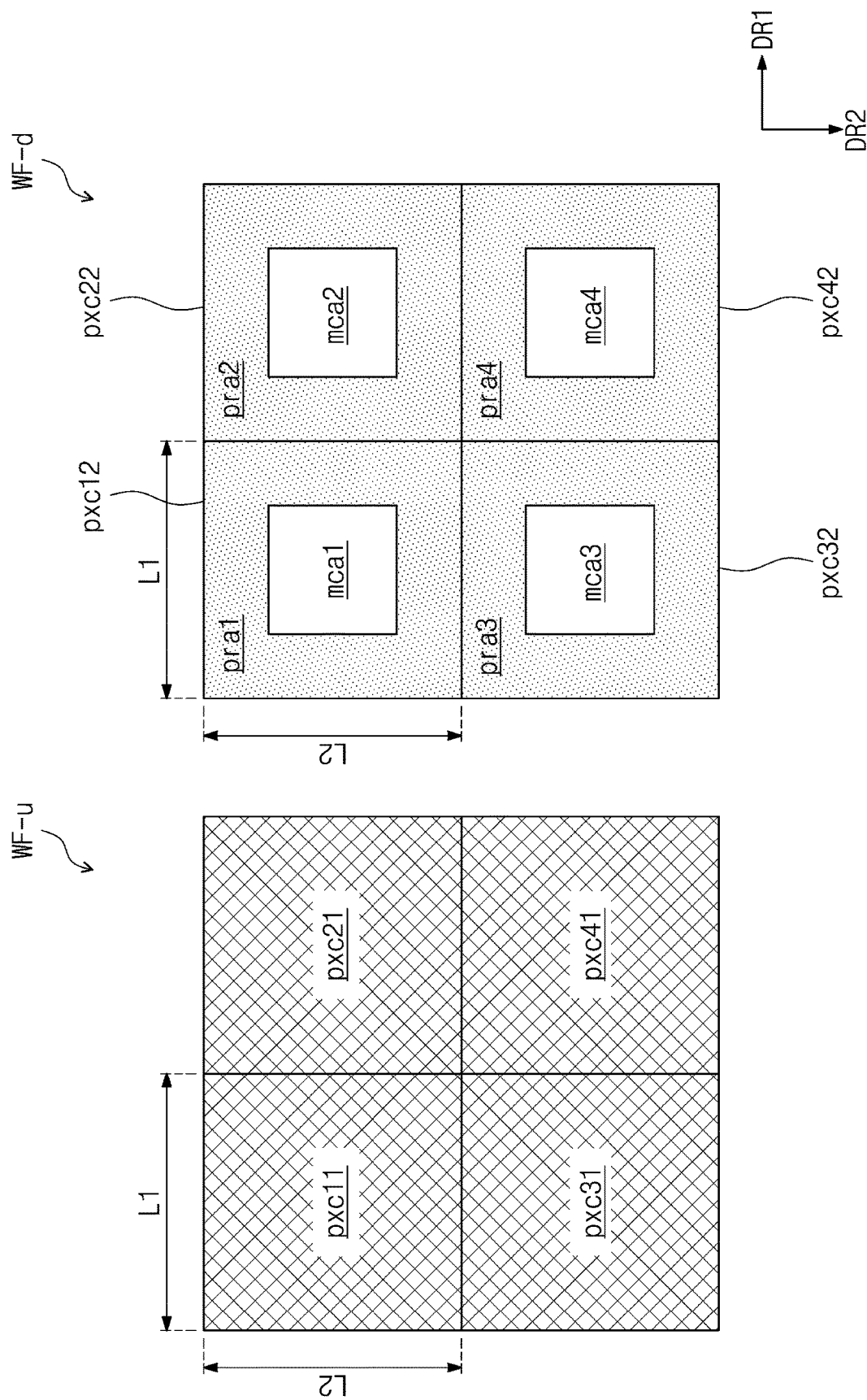

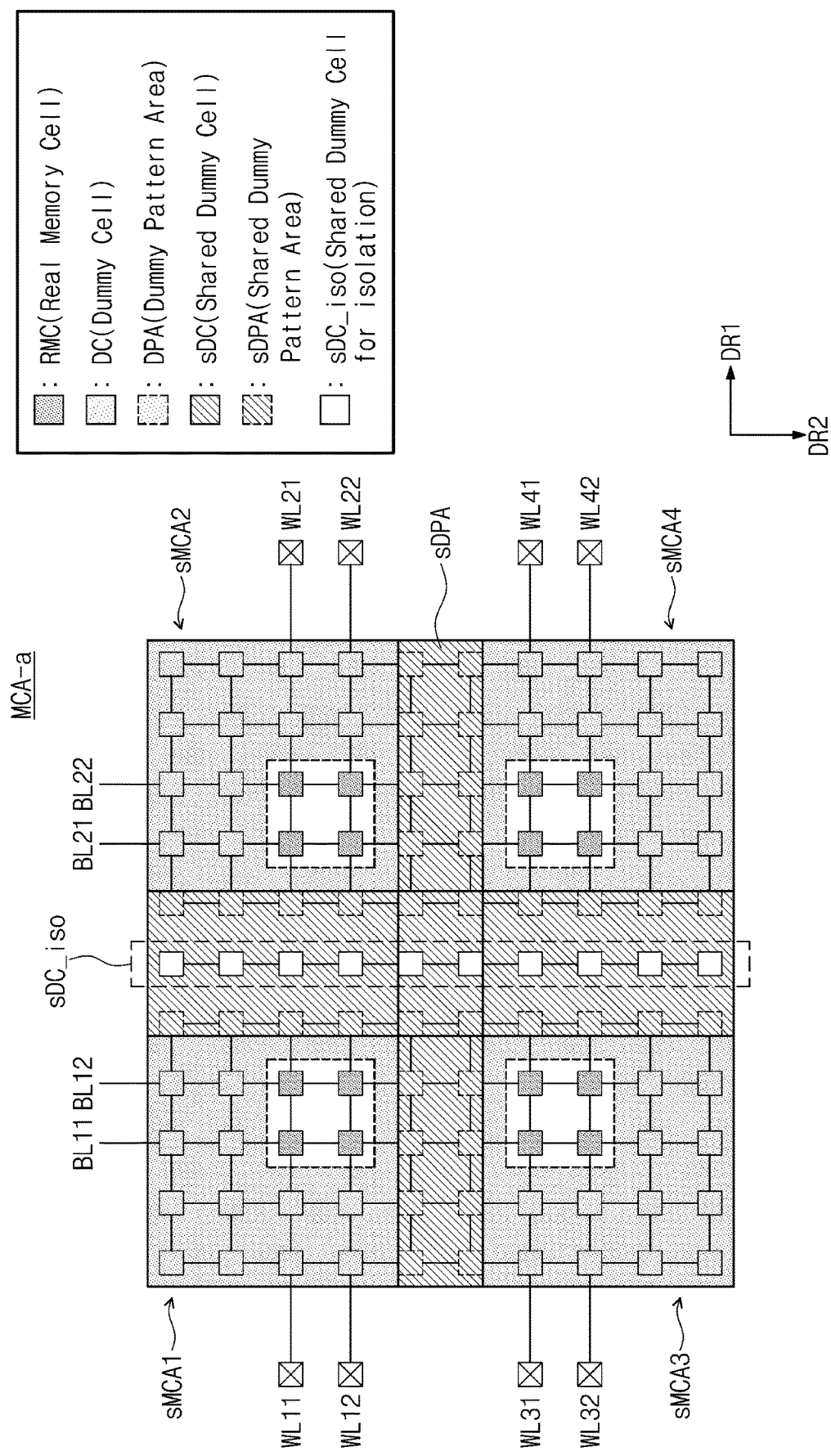

IMAGE SENSOR DEVICE

CROSS-REFERENCE TO RELATED APPLICATION

This application claims priority under 35 U.S.C. § 119 to Korean Patent Application No. 10-2019-0117504 filed on Sep. 24, 2019, in the Korean Intellectual Property Office, the disclosure of which is incorporated by reference herein in its entirety.

TECHNICAL FIELD

Exemplary embodiments of the inventive concept relate to a semiconductor device, and more particularly, to an image sensor device.

DISCUSSION OF RELATED ART

An image sensor is a sensor that detects and conveys information to make an image. It does this by converting an optical signal into an electrical signal. As the computer and communication industries develop, there is an increasing demand for a high-performance image sensor in various electronic devices such as a digital camera, a camcorder, a smartphone, a tablet personal computer (PC), a notebook, a game console, a security camera, and a medical micro camera.

A conventional image sensor includes analog pixels. The analog pixels output light signals as analog signals and the analog signals are converted into digital signals. However, the analog signals are vulnerable to a noise or coupling and may not process high-resolution image signals well.

SUMMARY

According to an exemplary embodiment of the inventive concept, an image sensor device includes: a first digital pixel including a first photo detector and first memory cells configured to store a first digital signal corresponding to a first output from the first photo detector, and a second digital pixel including a second photo detector and second memory cells configured to store a second digital signal corresponding to a second output from the second photo detector, wherein the second digital pixel is adjacent to one side of the first digital pixel along a first direction, wherein the first memory cells and the second memory cells are connected with a plurality of bit lines, wherein the first memory cells are connected with a first word line and a third word line, wherein the second memory cells are connected with a second word line and a fourth word line, wherein the second word line is between the first and third word lines, and wherein the third word line is between the second and fourth word lines.

According to an exemplary embodiment of the inventive concept, an image sensor device includes: a first digital pixel including a first photo detector and first memory cells configured to store a first digital signal corresponding to a first output from the first photo detector; and a second digital pixel including a second photo detector and second memory cells configured to store a second digital signal corresponding to a second output from the second photo detector, wherein the second digital pixel is adjacent to a first side of the first digital pixel along a first direction, wherein the first memory cells and the second memory cells are formed on a first semiconductor wafer, wherein the first semiconductor wafer includes: a first area including the first memory cells; a second area including the second memory cells, wherein the second area is adjacent to the first area along the first direction; a first shared dummy pattern area between a first side of the first area and a first side of the second area; a first dummy pattern area adjacent to a second side of the first area, which is opposite the first side of the first area; and a second dummy pattern area adjacent to a second side of the second area, which is opposite the first side of the second area, and wherein a first width of the first shared dummy pattern area in the first direction is smaller than two times a second width of the first dummy pattern area in the first direction or two times a third width of the second dummy pattern area in the second direction.

According to an exemplary embodiment of the inventive concept, an image sensor device includes a first digital pixel that includes a first photo detector and first memory cells configured to store a first digital signal corresponding to a first detection signal from the first photo detector, and a second digital pixel that includes a second photo detector and second memory cells configured to store a second digital signal corresponding to a second detection signal from the second photo detector, the second digital pixel is adjacent to the first digital pixel along a first direction, and the first memory cells and the second memory cells are included in a single memory cell array.

According to an exemplary embodiment of the inventive concept, an image sensor device includes: a first digital pixel including a first photo detector and first memory cells configured to store a first digital signal corresponding to a first detection signal from the first photo detector; and a second digital pixel including a second photo detector and second memory cells configured to store a second digital signal corresponding to a second detection signal from the second photo detector, wherein the second digital pixel is adjacent to the first digital pixel along a first direction, wherein dummy memory cells are disposed between the first and second memory cells, and wherein the dummy memory cells, the first memory cells, and the second memory cells are included in a single memory cell array.

BRIEF DESCRIPTION OF THE FIGURES

The above and other features of the inventive concept will become apparent by describing in detail exemplary embodiments thereof with reference to the accompanying drawings.

FIGS. 5A, 5B and 5C are plan views illustrating schematic layouts of an upper wafer and a lower wafer included in a pixel array of FIG. 4A.

FIG. 8 is a plan view illustrating a layout of a memory cell area of FIG. 6.

DETAILED DESCRIPTION OF THE EMBODIMENTS

Below, exemplary embodiments of the inventive concept will be described in detail with reference to the accompanying drawings.

Figure 1:
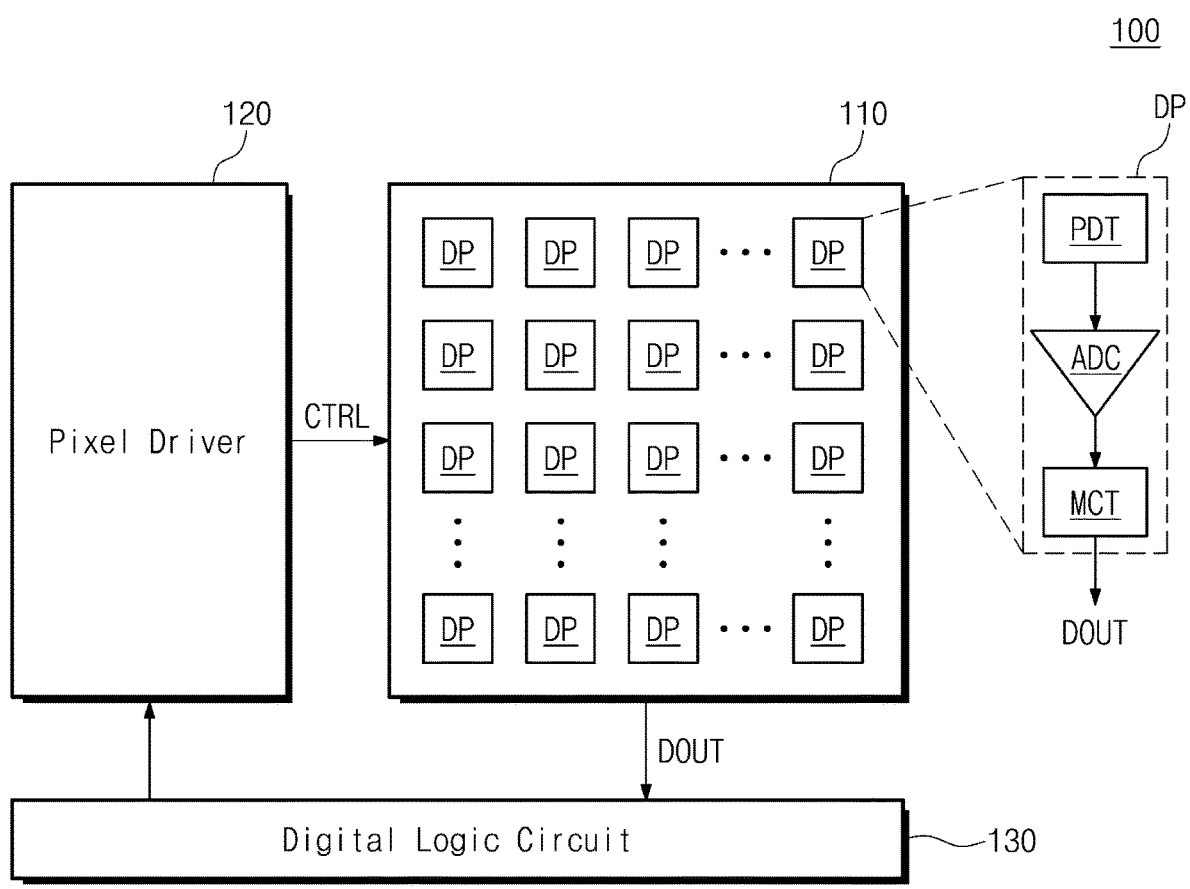
FIG. 1 is a block diagram illustrating an image sensor device according to an exemplary embodiment of the inventive concept.

FIG. 1 is a block diagram illustrating an image sensor device according to an exemplary embodiment of the inventive concept. Referring to FIG. 1, an image sensor device 100 may include a pixel array 110, a pixel driver 120, and a digital logic circuit 130. In an exemplary embodiment of the inventive concept, the image sensor device 100 may be a camera module included in various electronic devices such as a closed-circuit television (CCTV), a black box, a digital camera, a smartphone, a tablet personal computer (PC), and a notebook.

In a conventional CMOS image sensor (CIS), image pixels output analog signals based on a light signal. Analog signals from the CIS-based image pixels are converted into digital signals in units of a column at a separate analog-to-digital converter. In this case, a noise or coupling may occur while the analog signals converted by the CIS-based image pixels are transmitted to the analog-to-digital converter, thereby reducing the quality of a final image.

The pixel array 110 according to an exemplary embodiment of the inventive concept may include a plurality of digital pixels DP. Each of the digital pixels DP may be configured to sense a light signal from the outside and to output a digital signal DOUT corresponding to the sensed light signal.

For example, the digital pixel DP may include a photo detector PDT, an analog-to-digital converter ADC, and a memory circuit MCT. The photo detector PDT may be configured to convert a light signal sensed from the outside into an electrical signal, in other words, an analog signal. The analog-to-digital converter ADC may be configured to convert the analog signal output from the photo detector PDT into a digital signal. The memory circuit MCT may be configured to store the digital signal DOUT converted by the analog-to-digital converter ADC and to output the stored digital signal DOUT. Unlike a conventional CIS-based image pixel, the digital pixel DP according to an exemplary embodiment of the inventive concept may output the digital signal DOUT at a pixel level.

The pixel driver 120 may output various control signals CTRL (e.g., a photo detector control signal, a memory control signal, a ramp signal, and count information) for controlling the plurality of digital pixels DP included in the pixel array 110. Based on the control signals CTRL from the pixel driver 120, each of the plurality of digital pixels DP may perform a series of pixel operations or image detecting operations such as an operation of detecting a light signal to generate an analog signal, an operation of converting the analog signal into a digital signal, an operation of storing the digital signal, and an operation of outputting the stored digital signal.

The digital logic circuit 130 may perform digital signal processing on the digital signals DOUT received from the pixel array 110 and may provide a final image signal to an external device (e.g., an image signal processor (ISP) or an application processor (AP)). In an exemplary embodiment of the inventive concept, the digital logic circuit 130 may provide a driving signal to the pixel driver 120 under control of the external device. The pixel driver 120 may operate in response to the driving signal.

As described above, unlike the conventional CIS device, each of the plurality of digital pixels DP may generate and output the digital signal DOUT at a pixel level. This makes it possible to reduce the modification of the digital signal DOUT output from the plurality of digital pixels DP and to process an image signal at high speed. In other words, the digital signal DOUT output from the plurality of digital pixels DP is less susceptible to noise or coupling.

Figure 2A:
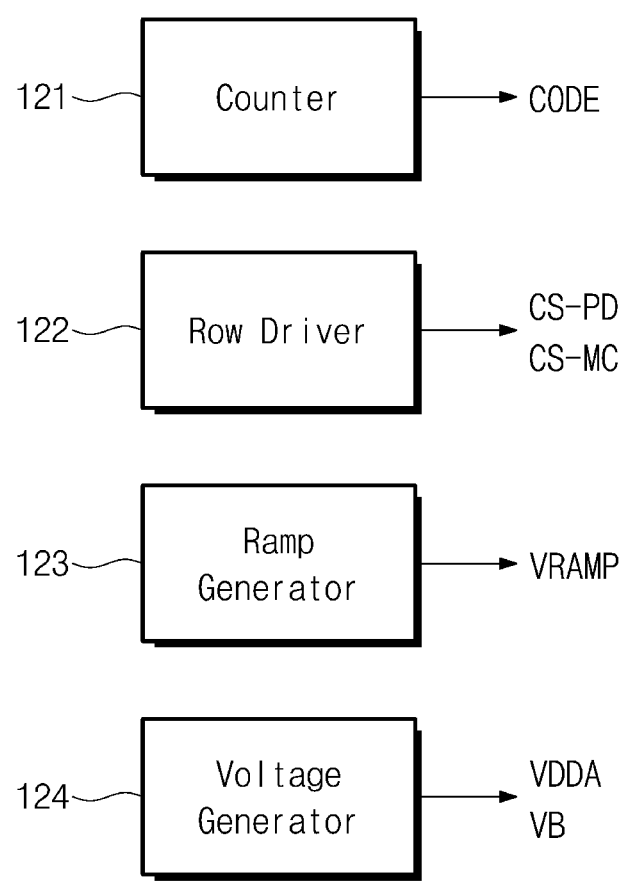
FIG. 2A is a block diagram illustrating a pixel driver of FIG. 1.

FIG. 2A is a block diagram illustrating a pixel driver of FIG. 1. Referring to FIGS. 1 and 2A, the pixel driver 120 may include a counter 121, a row driver 122, a ramp generator 123, and a voltage generator 124.

The counter 121 may sequentially increase or sequentially decrease a value of a code "CODE" in response to a clock (e.g., an operating clock or a system clock) during a given time. In other words, a value of the code "CODE" may sequentially vary over time.

The row driver 122 may generate a control signal for controlling each of the plurality of digital pixels DP. For example, the row driver 122 may generate a photo detector control signal CS-PD for controlling the photo detector PDT of each of the plurality of digital pixels DP. The row driver 122 may generate a memory control signal CS-MC for controlling the memory circuit MCT of each of the plurality of digital pixels DP.

The ramp generator 123 may output a ramp signal VRAMP. The ramp signal VRAMP may be used as a reference signal targeted for comparison with an analog signal at the digital pixel DP. In an exemplary embodiment of the inventive concept, the ramp signal VRAMP may be a uniformly increasing or decreasing signal (e.g., a signal increasing/decreasing with a single slope).

The voltage generator 124 may be configured to generate various voltages (e.g., a power supply voltage VDDA and a bias voltage VB) used by the image sensor device 100 to operate.

The photo detector control signal CS-PD, the memory control signal CS-MC, the code "CODE", and the ramp signal VRAMP may be included in the control signal CTRL described with reference to FIG. 1. In an exemplary embodiment of the inventive concept, each of the plurality of digital pixels DP included in the pixel array 110 may operate based on various signals CODE, CS-PD, CS-MC, VRAMP, VDDA, and VB generated from the pixel driver 120 described with reference to FIG. 2A.

Figure 2B:
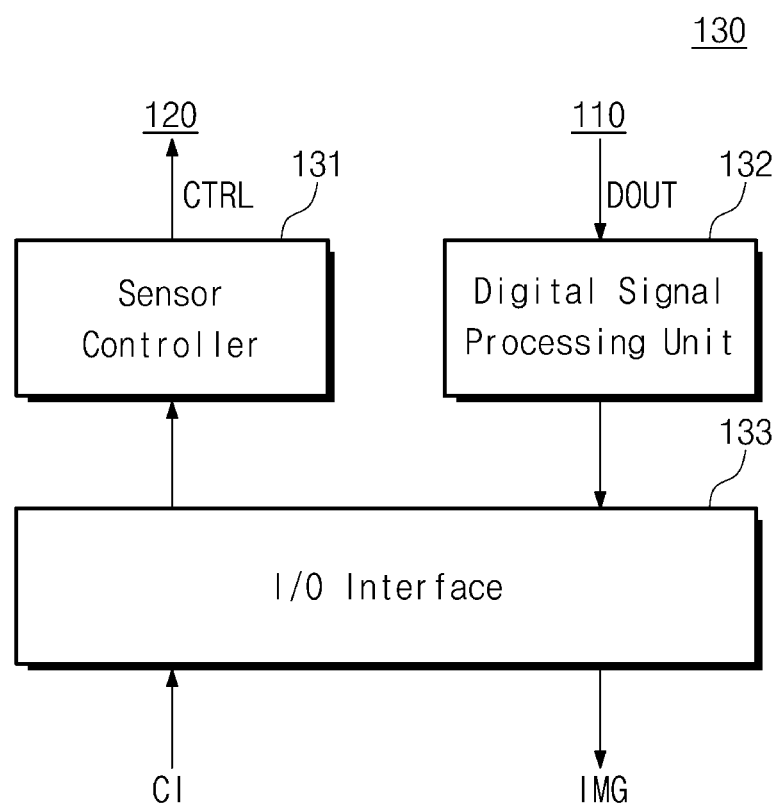
FIG. 2B is a block diagram illustrating a digital logic circuit of FIG. 1.

FIG. 2B is a block diagram illustrating a digital logic circuit of FIG. 1. Referring to FIGS. 1 and 2B, the digital logic circuit 130 includes a sensor controller 131, a digital signal processing unit 132, and an input/output interface 133.

The sensor controller 131 may be configured to control overall operations of the image sensor device 100. For example, the sensor controller 131 may control overall operations of the image sensor device 100 based on control information CI provided from an external device (e.g., an ISP or an AP) through the input/output interface 133. The sensor controller 131 may be a timing controller for controlling an operation timing of the pixel driver 120. In an exemplary embodiment of the inventive concept, the pixel driver 120 may generate various signals described above, based on timing signals from the sensor controller 131.

The digital signal processing unit 132 may receive the digital signals DOUT from the pixel array 110 and may perform digital signal processing on the received digital signals DOUT.

In an exemplary embodiment of the inventive concept, the digital signal DOUT output from one digital pixel DP may include a reset sampling value and a signal sampling value. The digital signal processing unit 132 may determine a final digital value corresponding to a light signal sensed by one digital pixel DP by performing an arithmetic operation on the reset sampling value and the signal sampling value.

The final image data IMG may be generated by combining final digital signals respectively determined by a plurality of digital pixels DP. In other words, a correlated double sampling (CDS) operation may be implemented through the digital signal DOUT that is generated by an operation of a comparator or an analog-to-digital converter ADC included in the digital pixel DP and a digital signal processing operation of the digital signal processing unit 132 included in the digital logic circuit 130.

The input/output interface 133 may be configured to receive the control information CI from an external device (e.g., an ISP or an AP) or to output the final image data IMG. In an exemplary embodiment of the inventive concept, the input/output interface 133 may exchange the above-described information with the external device in compliance with a protocol. In an exemplary embodiment of the inventive concept, the input/output interface 133 may include a physical layer for supporting the protocol.

FIGS. 3A to 3D are diagrams for describing a digital pixel of FIG. 1. For brevity of illustration and convenience of description, one digital pixel DP is described, but the inventive concept is not limited thereto. In addition, to easily describe an exemplary embodiment of the inventive concept, a structure or an operation of the digital pixel DP will be described with reference to an exemplary circuit diagram or block diagram, but the inventive concept is not limited thereto. For example, the digital pixel DP may be modified in various forms.

Referring to FIGS. 1, 2A, 2B, and 3A to 3D, the digital pixel DP may include the photo detector PDT, a comparator COMP, and the memory circuit MCT.

The photo detector PDT may be configured to output a detection signal DET in response to the photo detector control signal CS-PD from the pixel driver 120. For example, as illustrated in FIG. 38, the photo detector PDT may include a photo diode PD, a transfer transistor TX, and a reset transistor RX. The photo diode PD may be connected between a ground node and the transfer transistor TX and may be configured to accumulate photo charges in response to the magnitude of light incident from the outside. The transfer transistor TX may be connected between a floating diffusion node FD and the photo diode PD and may operate in response to a transfer signal TG. For example, the transfer transistor TX may be configured to transfer the charges accumulated at the photo diode PD to the floating diffusion node FD in response to the transfer signal TG. The reset transistor RX may be connected between the power supply voltage VDDA and the floating diffusion node FD and may operate in response to a reset signal RG. For example, the reset transistor RX may reset a voltage level of the floating diffusion node FD in response to the reset signal RG. In an exemplary embodiment of the inventive concept, the photo detector control signal CS-PD may include the transfer signal TG and the reset signal RG described above. In an exemplary embodiment of the inventive concept, depending on the operation of the photo detector PDT, a voltage (e.g., VFD) of the floating diffusion node FD may change, and this change may be output as the detection signal DET.

The comparator COMP may compare the detection signal DET (or the voltage VFD of the floating diffusion node FD) from the photo detector PDT and the ramp signal VRAMP and may output a comparison signal COMP-OUT based on a comparison result.

Figure 3A:
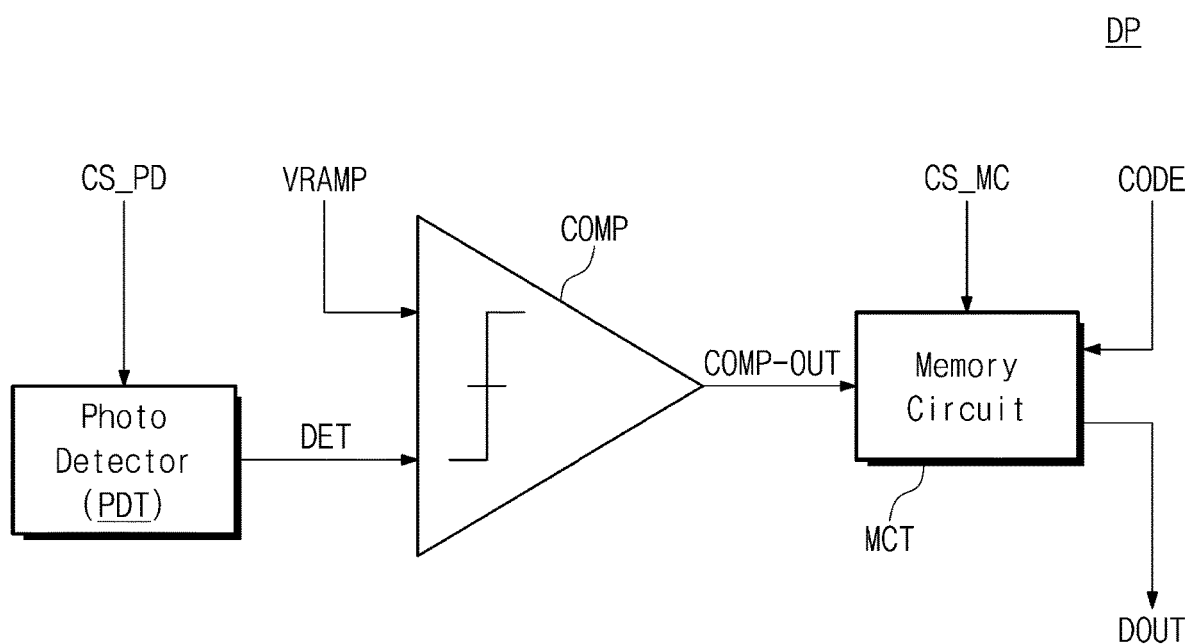
FIGS. 3A, 3B, 3C and 3D are diagrams for describing a digital pixel of FIG. 1.
Figure 3B:
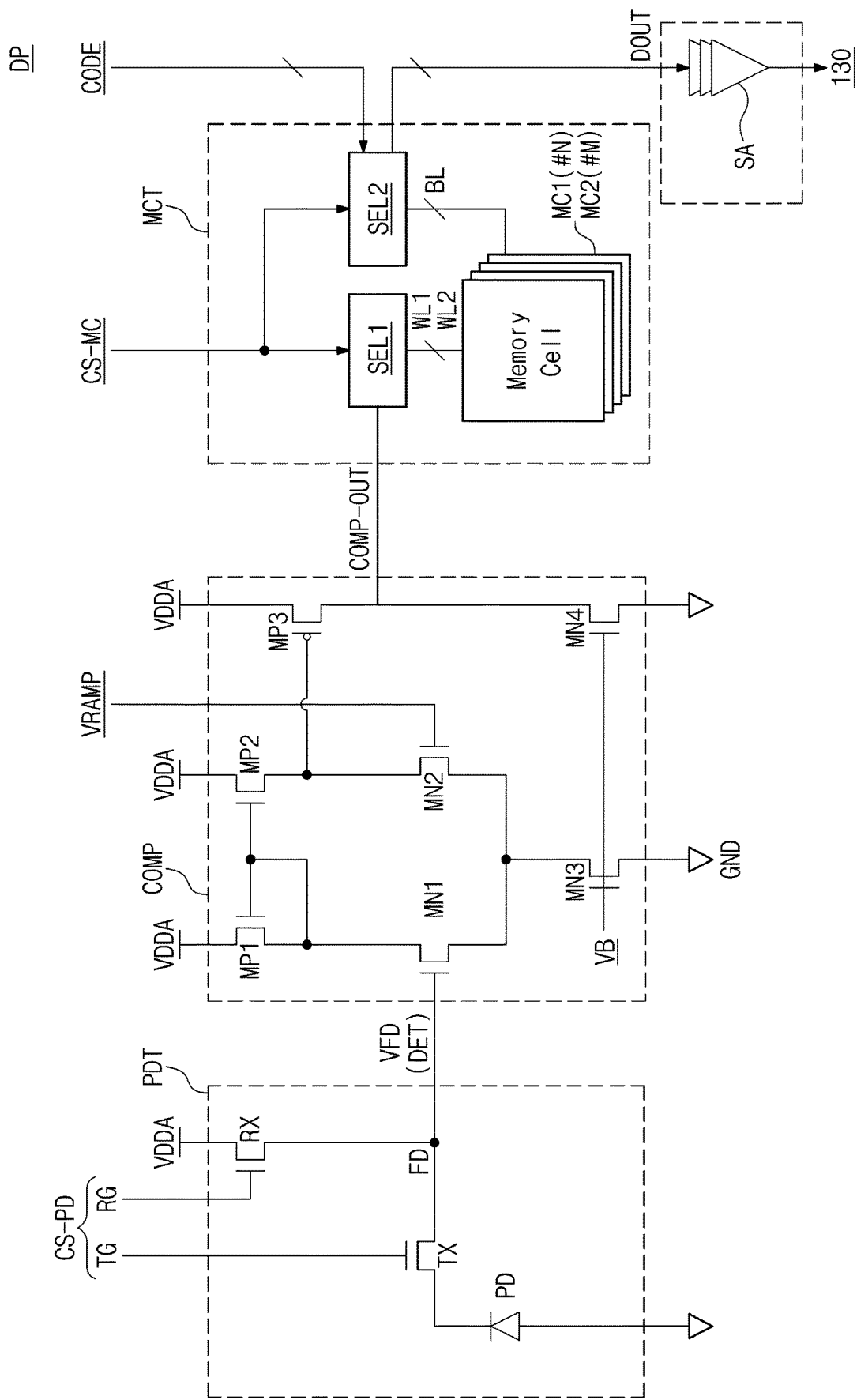

In an exemplary embodiment of the inventive concept, the comparator COMP may be a low-power comparator. For example, as illustrated in FIG. 3B, the comparator COMP may include first, second and third p-type metal oxide semiconductor (PMOS) transistors MP1, MP2 and MP3 and first, second, third and fourth n-type metal oxide semiconductor transistors (NMOS) MN1, MN2, MN3 and MN4. The first PMOS transistor MP1, the first NMOS transistor MN1, and the third NMOS transistor MN3 may be connected in series between the power supply voltage VDDA and a ground voltage GND. A gate of the first PMOS transistor MP1 may be connected to a node between the first PMOS transistor MP1 and the first NMOS transistor MN1. A gate of the first NMOS transistor MN1 may be connected to the floating diffusion node FD and may be configured to receive the detection signal DET. A gate of the third NMOS transistor MN3 may be configured to receive the bias voltage VB. The second PMOS transistor MP2 and the second NMOS transistor MN2 may be connected in series between the power supply voltage VDDA and the ground voltage GND. A gate of the second PMOS transistor MP2 may be connected to the gate of the first PMOS transistor MP1. A gate of the second NMOS transistor MN2 may be configured to receive the ramp signal VRAMP. The third PMOS transistor MP3 and the fourth NMOS transistor MN4 may be connected in series between the power supply voltage VDDA and the ground voltage GND. A gate of the third PMOS transistor MP3 may be connected to a node between the second PMOS transistor MP2 and the second NMOS transistor MN2. A gate of the fourth NMOS transistor MN4 may be configured to receive the bias voltage VB.

In the comparator COMP illustrated in FIG. 38, when the detection signal DET is lower than the ramp signal VRAMP, the comparison signal COMP-OUT may have a level of logic high; and when the detection signal DET is higher than the ramp signal VRAMP, the comparison signal COMP-OUT may have a level of logic low.

In an exemplary embodiment of the inventive concept, the structure of the comparator COMP of FIG. 3B is exemplary, and the inventive concept is not limited thereto. For example, the comparator COMP may have structures of various comparators or differential amplifiers configured to compare the detection signal DET and the ramp signal VRAMP and to output the comparison signal COMP-OUT based on a comparison result.

The memory circuit MCT may be configured to store the code "CODE" in response to the comparison signal COMP-OUT and the memory control signal CS-MC or to output the stored code "CODE" as the digital signal DOUT in response to the comparison signal COMP_OUT and the memory control signal CS-MC. For example, as illustrated in FIG. 3B, the memory circuit MCT may include first and second selection circuits SEL1 and SEL2 and a plurality of memory cells MC1 and MC2.

Each of the plurality of memory cells MC1 and MC2 may be one of various forms of data storage components, which are configured to store the code "CODE" at a particular timing, such as a dynamic random access memory (DRAM) cell, a synchronous dynamic random access memory (SDRAM) cell, and a latch. The plurality of memory cells MC1 and MC2 may be connected with first and second word lines WL1 and WL2 and bit lines BL. Depending on levels of the first and second word lines WL1 and WL2, the plurality of memory cells MC1 and MC2 may store the code "CODE" provided through the bit lines BL or may output the stored code "CODE" through the bit lines BL as the digital signal DOUT.

In an exemplary embodiment of the inventive concept, the number of first memory cells MC1 of the plurality of memory cells MC1 and MC2 may be "N" (N being a natural number of 2 or more), and the number of second memory cells MC2 of the plurality of memory cells MC1 and MC2 may be "M" (M being a natural number). In an exemplary embodiment of the inventive concept, the number "N" of first memory cells MC1 may be equal to or different from the number "M" of second memory cells MC2.

In an exemplary embodiment of the inventive concept, the first memory cells MC1 may be configured to store a reset sampling value "R", and the second memory cells MC2 may be configured to store a signal sampling value "S". The first memory cells MC1 may be connected with the first word line WL1 and the bit lines BL, and the second memory cells MC2 may be connected with the second word line WL2 and the bit lines BL.

Figure 3C:
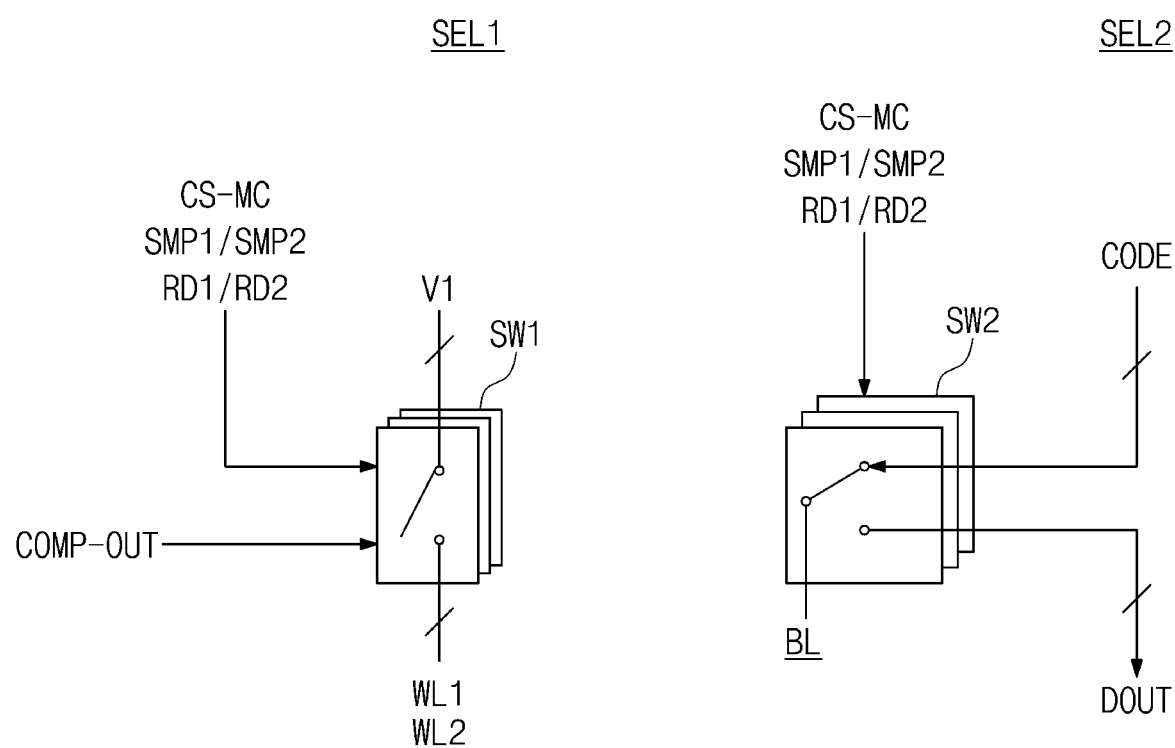

The first selection circuit SEL1 may be configured to control the first and second word lines WL1 and WL2 in response to the comparison signal COMP-OUT and the memory control signal CS-MC. For example, as illustrated in FIG. 3C, the first selection circuit SEL may include first switches SW1. Each of the first switches SW1 may be configured to provide a first voltage V1 to one of the first word line WL1 and the second word line WL2 in response to the comparison signal COMP-OUT and the memory control signal CS-MC. In an exemplary embodiment of the inventive concept, the first voltage V1 may be a voltage high enough to activate each of the plurality of memory cells MC1 and MC2 (e.g., a high voltage for activating a selection transistor in the case where memory cells am DRAM cells).

For example, the memory control signal CS-MC may include first and second sampling signals SMP1 and SMP2 and first and second read signals RD1 and RD2. The first sampling signal SMP1 may be a signal for storing the reset sampling value "R" in the first memory cells MC1, and the second sampling signal SMP2 may be a signal for storing the signal sampling value "S" in the second memory cells MC2. The first read signal RD1 may be a signal for outputting the reset sampling value "R" stored in the first memory cells MC1 as the digital signal DOUT, and the second read signal RD2 may be a signal for outputting the signal sampling value "S" stored in the second memory cells MC2 as the digital signal DOUT. However, the inventive concept is not limited thereto. For example, the memory control signal CS-MC for controlling the memory circuit MCT may be variously changed or modified.

In the case where the first sampling signal SMP1 or the first read signal RD1 is activated, the first switches SW1 may provide the first voltage V1 to the first word line WL1 in response to a falling edge (or a rising edge) of the comparison signal COMP-OUT. As such, the first memory cells MC1 connected with the first word line WL1 may be activated. In this case, a value of the code "CODE" may be stored in the first memory cells MC1, or a value (e.g., the reset sampling value "R") stored in the activated first memory cells MC1 may be output.

In the case where the second sampling signal SMP2 or the second read signal RD2 is activated, the first switches SW1 may provide a second voltage V2 to the second word line WL2 in response to a falling edge (or a rising edge) of the comparison signal COMP-OUT. As such, the second memory cells MC2 connected with the second word line WL2 may be activated. In this case, a value of the code "CODE" may be stored in the second memory cells MC2, or a value (e.g., the signal sampling value "S") stored in the activated second memory cells MC2 may be output.

As described above, the first selection circuit SEL1 may select at least one of a group of the first memory cells MC1 and a group of the second memory cells MC2 in response to the comparison signal COMP-OUT and the memory control signal CS-MC.

In response to the memory control signal CS-MC, the second selection circuit SEL2 may be configured to provide the code "CODE" to the bit lines BL or to output the digital signal DOUT from the bit lines BL. For example, as illustrated in FIG. 3C, the second selection circuit SEL2 may include second switches SW2. In response to the memory control signal CS-MC, the second switches SW2 may be configured to connect the bit lines BL with one of a group of lines receiving the code "CODE" and a group of lines outputting the digital signal DOUT.

For example, in the case where the first sampling signal SMP1 or the second sampling signal SMP2 is activated, the second switches SW2 may connect the bit lines BL with the lines receiving the code "CODE". In this case, the code "CODE" provided from the counter 121 may be provided to the first memory cells MC1 or the second memory cells MC2 through the bit lines BL. In the case where the first read signal RD1 or the second read signal RD2 is activated, the second switches SW2 may connect the bit lines BL with the lines receiving the digital signal DOUT. In this case, the value (e.g., the reset sampling value "R" or the signal sampling value "S") stored in the first memory cells MC1 or the second memory cells MC2 may be output as the digital signal DOUT.

In an exemplary embodiment of the inventive concept, the first selection circuit SEL1 and the second selection circuit SEL2 illustrated in FIG. 3C is exemplary, and the inventive concept is not limited thereto. For example, each of the first and second selection circuits SEL1 and SEL2 may be variously changed or modified to store or read information (e.g., the reset sampling value "R" or the signal sampling value "S") corresponding to memory cells associated with the digital pixel DP. In an exemplary embodiment of the inventive concept, each of the first and second selection circuits SEL1 and SEL2 may be variously modified depending on the number of word lines, the number of bit lines, a way to route word lines, and a way to route bit lines. An exemplary embodiment of the inventive concept is illustrated as the first and second selection circuits SEL1 and SEL2 are included in one digital pixel DP, but the inventive concept is not limited thereto. For example, the first and second selection circuits SEL1 and SEL2 may be disposed in units of a pixel group including a plurality of digital pixels DP.

As described above, the digital pixel DP according to an exemplary embodiment of the inventive concept may be configured to generate an analog signal corresponding to light received from the outside and to convert and output the generated analog signal into a digital signal. Below, a schematic operation of the digital pixel DP will be described with reference to FIG. 3D.

Figure 3D:
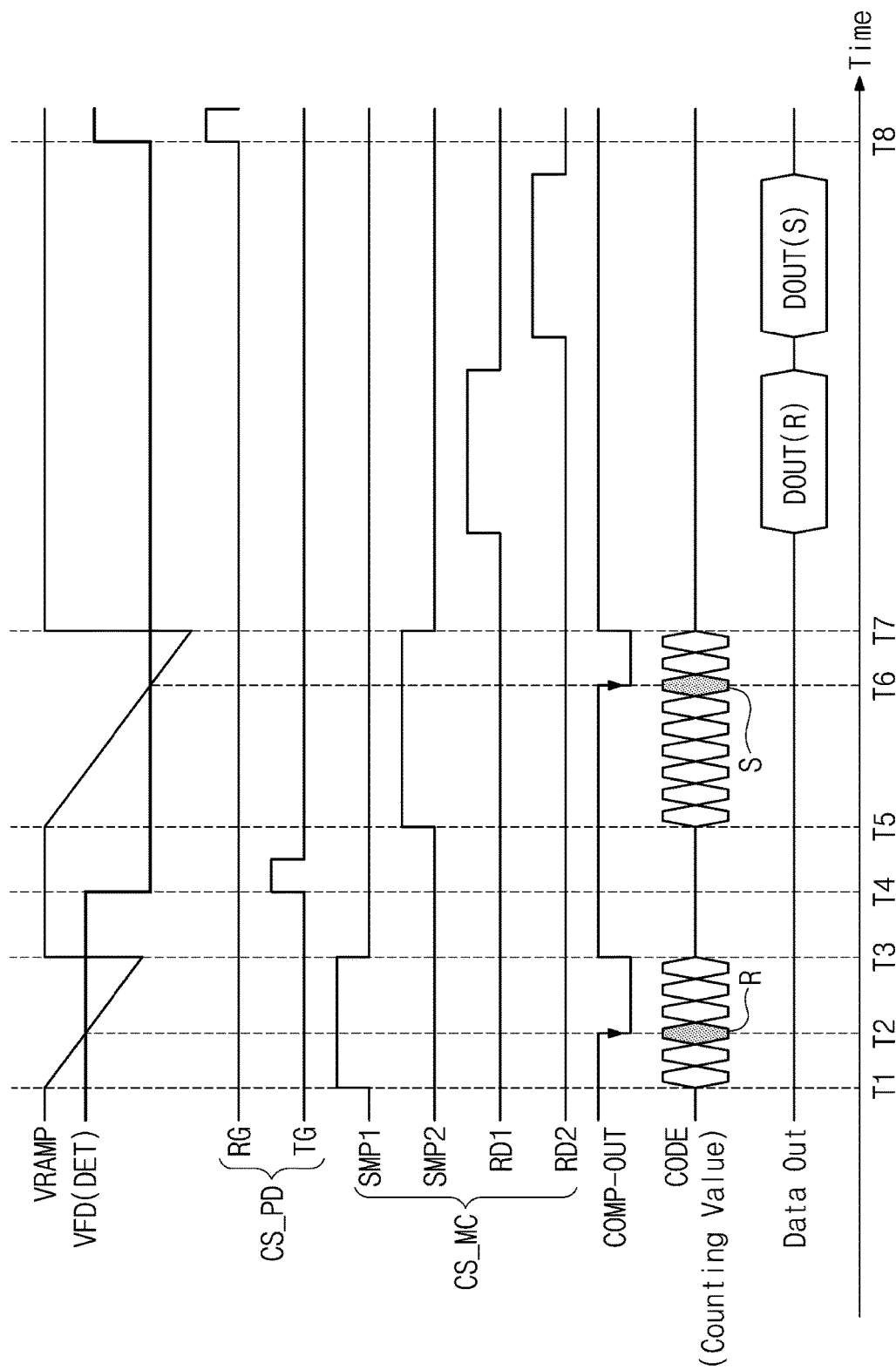

As illustrated in FIG. 3D, the first sampling signal SMP1 may be activated from a first time T1 to a third time T3. In other words, during a time period from the first time T1 to the third time T3, a sampling operation may be performed on a reset level of the photo detector PDT.

For example, during the activation of the first sampling signal SMP1, the ramp generator 123 may output the ramp signal VRAMP that uniformly decreases (e.g., decreases at a single slope), and the counter 121 may sequentially output the code "CODE" that increases or decreases at a given interval. At a second time T2, a level of the ramp signal VRAMP may become smaller than a level (e.g., VFD) of the floating diffusion node FD. In this case, the output signal COMP-OUT of the comparator COMP may transition from the high level to the low level. In other words, when the ramp signal VRAMP crosses a predetermined threshold the output signal COMP-OUT transitions.

Because the first sampling signal SMP1 is in an active state at a falling edge (e.g., the second time T2) of the output signal COMP-OUT of the comparator COMP, the code "CODE" may be provided to the bit lines BL by the second selection circuit SEL2. In addition, the first memory cells MC1 may be activated by the first selection circuit SEL1. In other words, a value of the code "CODE" may be stored in the first memory cells MC1 as the reset sampling value "R" at the second time T2.

Afterwards, the transfer transistor TX of the photo detector PDT may be turned on in response to the transfer signal TG activated at a fourth time T4, and thus charges accumulated by the photo diode PD may be transferred to the floating diffusion node FD. As such, at the time T4, the level (e.g., VFD) of the floating diffusion node FD (or a level of the detection signal DET) may decrease as much as a level corresponding to the amount of transferred charges.

Afterwards, the second sampling signal SMP2 may be activated from a fifth time T5 to a seventh time T7. In other words, during a time period from the fifth time T5 to the seventh time T7, a signal sampling operation may be performed on the detection signal DET from the photo detector PDT.

As in the above description, for example, during the activation of the second sampling signal SMP2, the ramp generator 123 may output the ramp signal VRAMP, and the counter 121 may output the code "CODE". At the sixth time T6, the detection signal DET may become lower than the ramp signal VRAMP. In this case, the output signal COMP-OUT of the comparator COMP may transition from the high level to the low level. In other words, when the ramp signal VRAMP crosses another predetermined threshold the output signal COMP-OUT transitions.

Because the second sampling signal SMP2 is in an active state at a falling edge (e.g., the sixth time T6) of the output signal COMP-OUT of the comparator COMP, the code "CODE" may be provided to the bit lines BL by the second selection circuit SEL2. In addition, the second memory cells MC2 may be activated by the second selection circuit SEL2. In other words, a value "S" of the code "CODE" may be stored in the second memory cells MC2 at the sixth time T6.

Afterwards, during an activation period of the first read signal RD1, the first memory cells MC1 may be activated by the first selection circuit SEL1, and the bit lines BL may be connected with output signal lines (e.g., lines outputting the digital signal DOUT) by the second selection circuit SEL2. In this case, the value (e.g., the reset sampling value "R") stored in the first memory cells MC1 may be output as the digital signal DOUT. For example, the reset sampling voltage "R" stored in the first memory cells MC1 may be output as the digital signal DOUT between the seventh time T7 and an eighth time T8.

Afterwards, during an activation period of the second read signal RD2, the second memory cells MC2 may be activated by the second selection circuit SEL2, and the bit lines BL may be connected with the output signal lines by the second selection circuit SEL2. In this case, the value (e.g., the signal sampling value "S") stored in the second memory cells MC2 may be output as the digital signal DOUT. For example, the signal sampling voltage "S" stored in the second memory cells MC2 may be output as the digital signal DOUT between the seventh time T7 and the eighth time T8.

Afterwards, at the eighth time T8, the reset transistor RX may be turned on in response to the activation of the reset signal RG, and thus, the level VFD of the floating diffusion node FD may be reset.

In an exemplary embodiment of the inventive concept, the digital signal DOUT (or the reset sampling value "R" and the signal sampling value "S") output from the memory circuit MCT may be provided to the digital logic circuit 130 through a sense amplifier SA. In an exemplary embodiment of the inventive concept, the sense amplifier SA may be disposed in units of a column of a plurality of pixels included in the pixel array 110.

The structure or operation of the digital pixel DP described with reference to FIGS. 3A to 3D is exemplary, and the inventive concept is not limited thereto. For example, the structure or operation of the digital pixel DP may be variously changed depending on a way to implement the digital pixel DP.

Figure 4A:
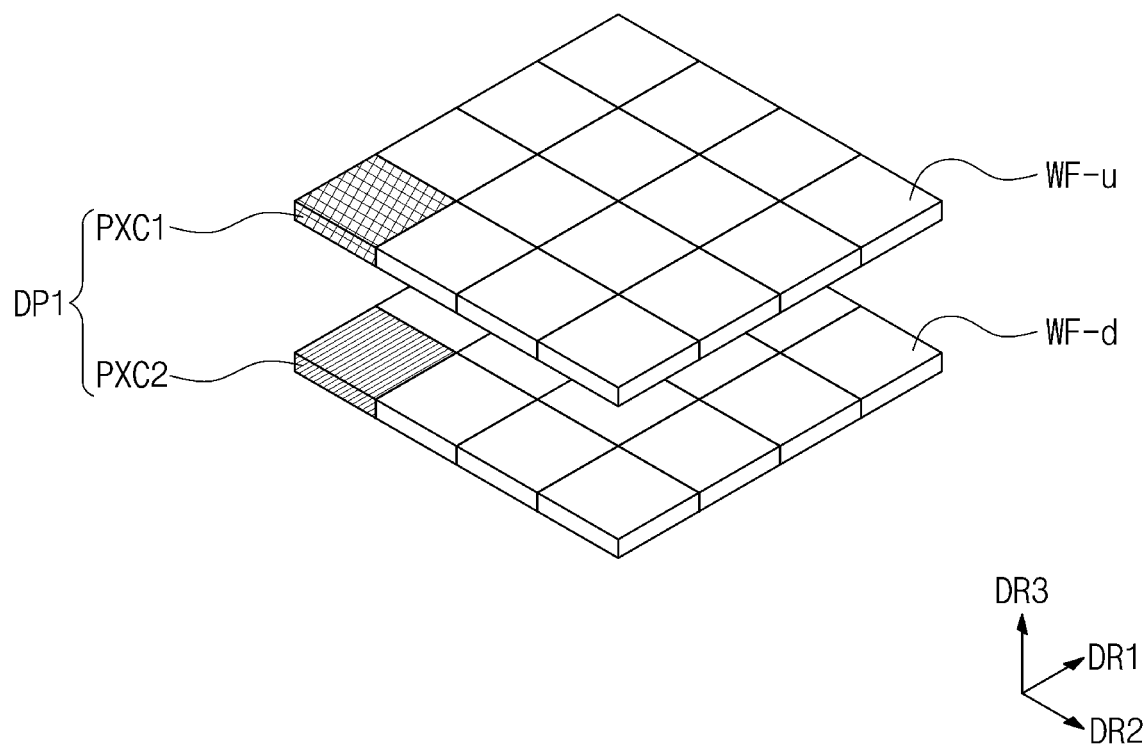
FIGS. 4A and 4B are diagrams illustrating a configuration of a pixel array of FIG. 1.
Figure 4B:
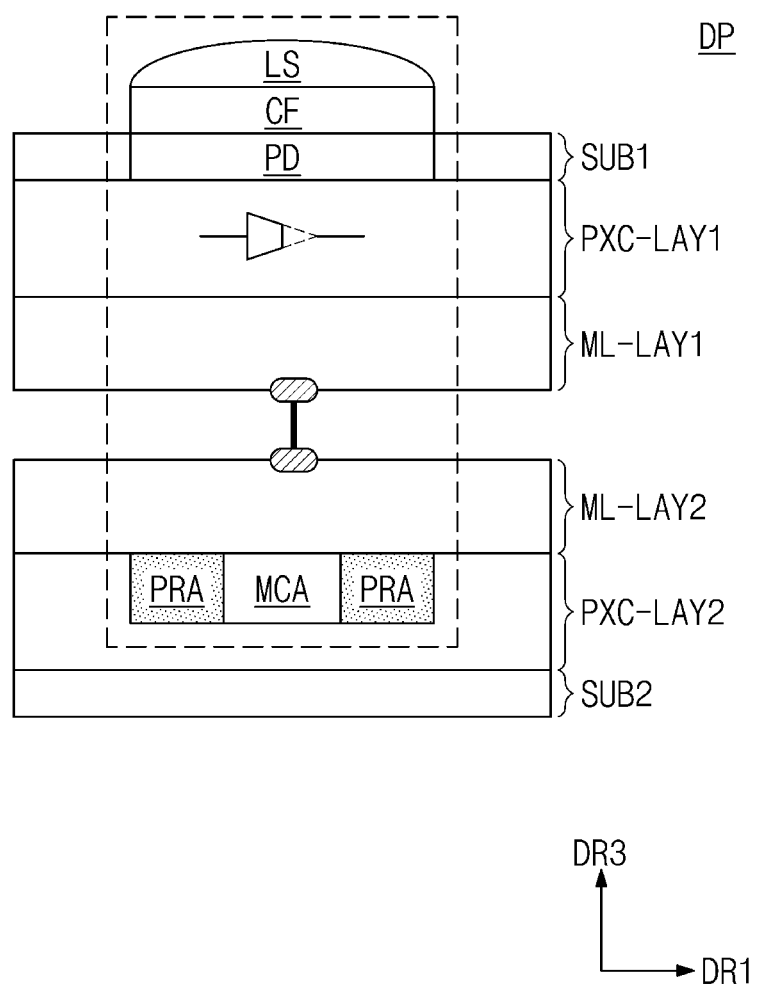

FIGS. 4A and 4B are diagrams illustrating a configuration of the pixel array 110 of FIG. 1. Referring to FIGS. 1, 4A, and 4B, the pixel array 110 may include an upper wafer WF-u and a lower wafer WF-d. The upper wafer WF-u may be stacked on the lower wafer WF-d (e.g., in a third direction DR3).

Each of the upper wafer WF-u and the lower wafer WF-d may include a semiconductor pattern formed on a semiconductor substrate. The upper wafer WF-u may include a plurality of first pixel circuits PXC1, and the lower wafer WF-d may include a plurality of second pixel circuits PXC2.

In an exemplary embodiment of the inventive concept, each of the plurality of first pixel circuits PXC1 may be formed in a corresponding one of first pixel circuit areas of the upper wafer WF-u, and each of the plurality of second pixel circuits PXC2 may be formed in a corresponding one of second pixel circuit areas of the lower wafer WF-d. Below, for convenience of description, the term "pixel circuit" is used, but the term "pixel circuit" may indicate relevant components depending on an exemplary embodiment of the inventive concept or a disclosed context or may indicate an area where the relevant components are formed.

One of the plurality of first pixel circuits PXC1 and one of the plurality of second pixel circuits PXC2 may constitute one digital pixel DP. For example, the first pixel circuit PXC1 included in the upper wafer WF-u may include some components of one digital pixel DP described with reference to FIGS. 3A to 3D, and the second pixel circuit PXC2 included in the lower wafer WF-d may include the remaining components of the digital pixel DP described with reference to FIGS. 3A to 3D. In an exemplary embodiment of the inventive concept, one digital pixel DP may be implemented by electrically connecting the first pixel circuit PXC1 of the upper wafer WF-u and the second pixel circuit PXC2 of the lower wafer WF-d. In an exemplary embodiment of the inventive concept, the first pixel circuit PXC1 and the second pixel circuit PXC2 may be electrically connected through a connection structure (e.g., through silicon via (TSV) or Cu-to-Cu bonding) between the upper wafer WF-u and the lower wafer WF-d.

In an exemplary embodiment of the inventive concept, the first pixel circuit PXC1 and the second pixel circuit PXC2, which constitutes one digital pixel DP, may be arranged on a plane formed by first and second directions DR1 and DR2, to overlap each other and to be aligned with each other. For example, as illustrated in FIG. 4B, the first pixel circuit PXC1 of the upper wafer WF-u may include the photo detector PDT and a portion of the comparator COMP of FIG. 3B. In this case, as illustrated in FIG. 4B, the photo diode PD may be formed at a first substrate SUB1, and a color filter CF and a lens LS may be formed on the photo diode PD.

A first pixel circuit layer PXC-LAY1 may be formed under the first substrate SUB. The transfer transistor TX and the reset transistor RX of the photo detector PDT and a portion of the comparator COMP may be formed at the first pixel circuit layer PXC-LAY1. In an exemplary embodiment of the inventive concept, the portion of the comparator COMP may include at least one of various transistors included in the comparator COMP.

A first metal layer ML-LAY1 may be formed under the first pixel circuit layer PXC-LAY1. Metal lines (or wires) for connecting various components included in the upper wafer WF-u may be formed at the first metal layer ML-LAY1.

The lower wafer WF-d may be formed at a second substrate SUB2. For example, the second pixel circuit PXC2 included in the lower wafer WF-d may include the remaining portion of the comparator COMP and the memory circuit MCT. The remaining portion of the comparator COMP and the memory circuit MCT may be formed at a second pixel circuit layer PXC-LAY2 on the second substrate SUB2.

A second metal layer ML-LAY2 may be formed on the second pixel circuit layer PXC-LAY2. The second metal layer ML-LAY2 may include metal lines (or wires) for connecting components.

In an exemplary embodiment of the inventive concept, the memory circuit MCT of the digital pixel DP may be included in the second pixel circuit PXC2 of the lower wafer WF-d. In this case, memory cells MC included in the memory circuit MCT may be formed in a memory cell area MCA placed at the second pixel circuit layer PXC-LAY2, and the remaining components of the second pixel circuit PXC2 may be formed at a peripheral area PRA.

As described above, the pixel array 110 or a plurality of digital pixels DP of the image sensor device 100 according to an exemplary embodiment of the inventive concept may be implemented by stacking the upper wafer WF-u and the lower wafer WF-d to be electrically connected to each other.

Figure 5B:
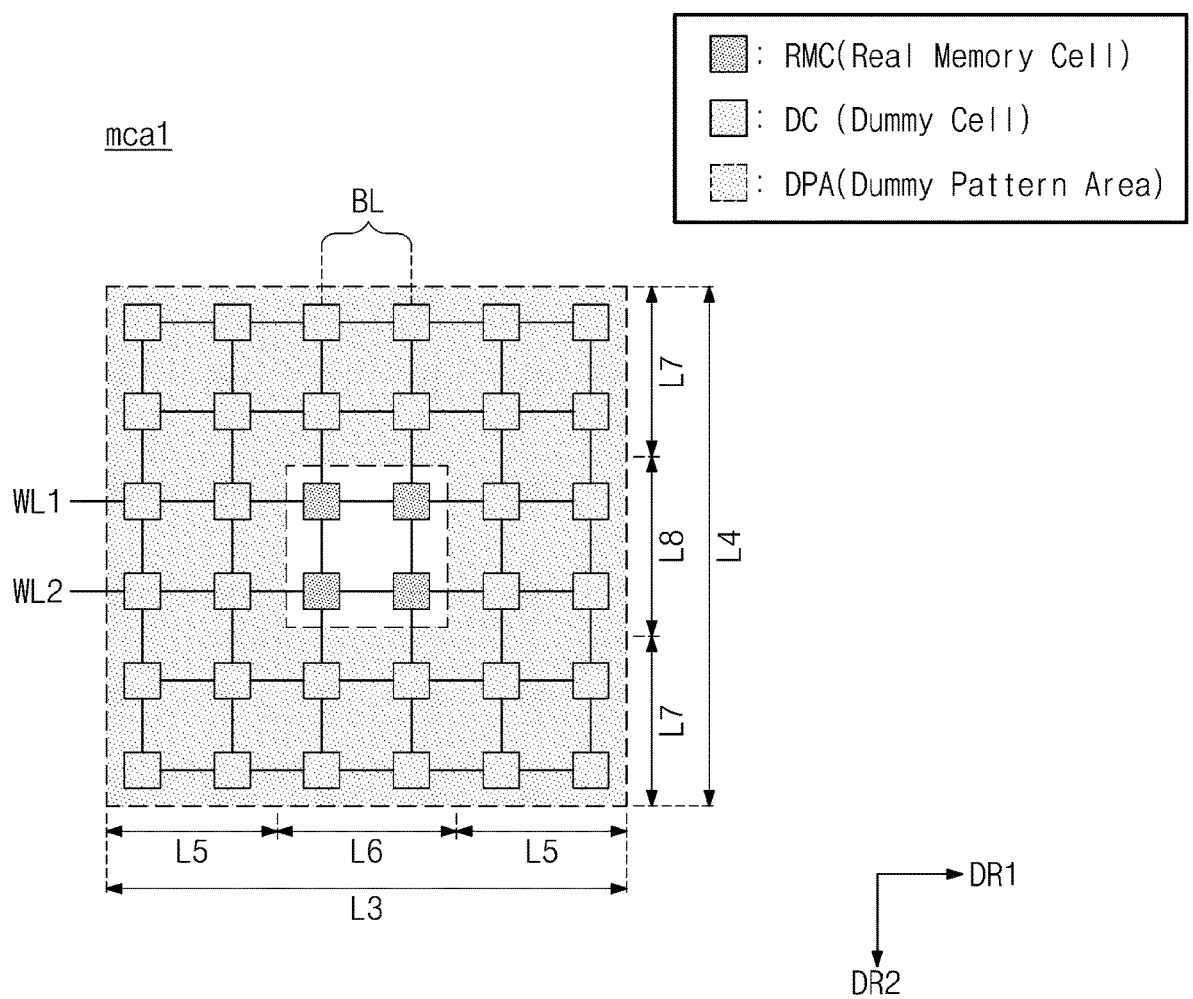
Figure 5C:
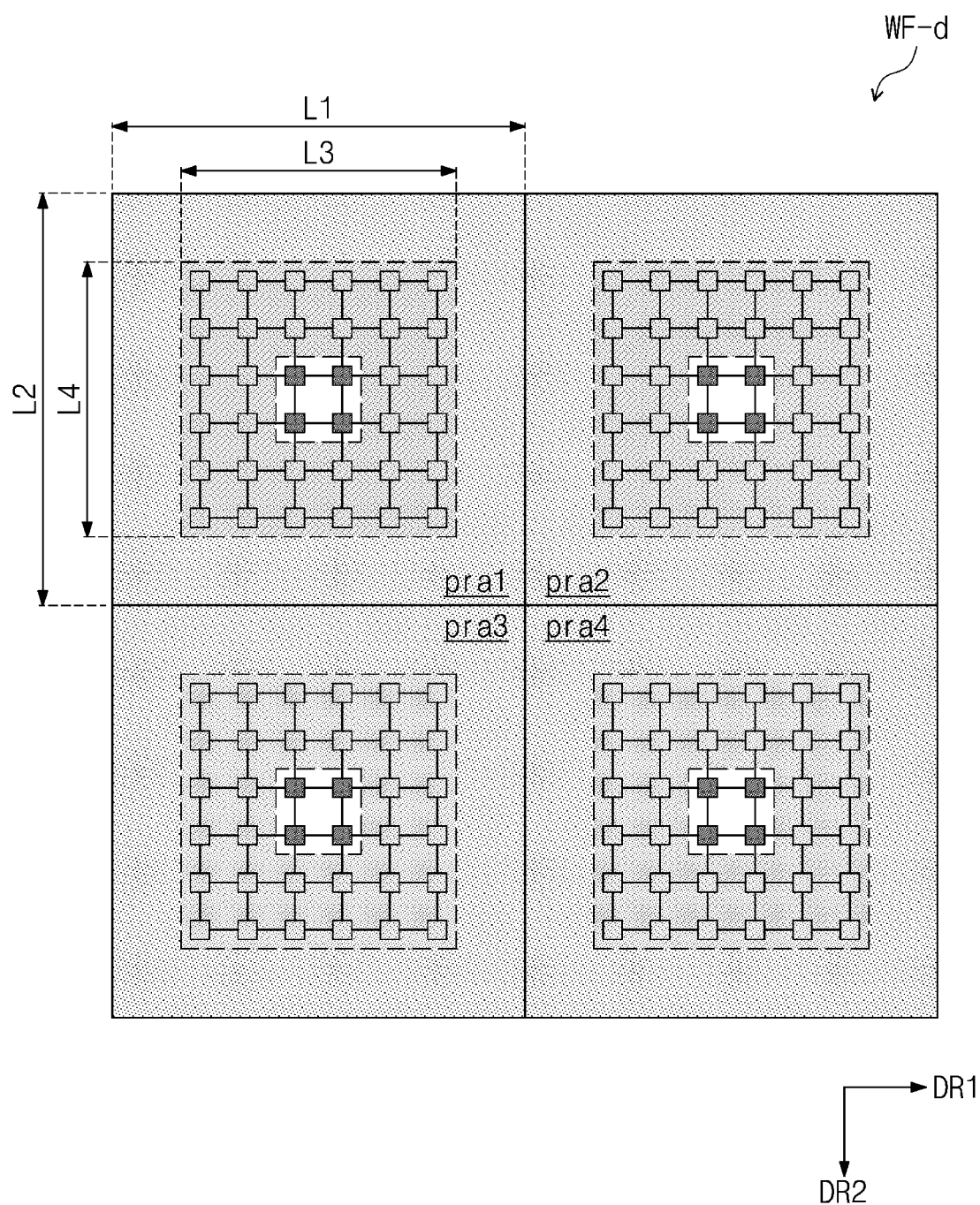

FIGS. 5A to 5C are plan views illustrating schematic layouts of an upper wafer and a lower wafer included in a pixel array. For brevity of illustration and convenience of description, a layout associated with four digital pixels DP is illustrated in drawings below, but the inventive concept is not limited thereto. For example, other digital pixels DP may be expanded to be similar to the above example.

Referring to FIG. 5A, the upper wafer WF-u may include four first pixel circuits pxc11, pxc21, pxc31, and pxc41, and the first pixel circuits pxc11 to pxc41 may be arranged in a 2×2 matrix. The lower wafer WF-d may include four second pixel circuits pxc2, pxc22, pxc32, and pxc42, and the second pixel circuits pxc12 to pxc42 may be arranged in a 2×2 matrix. Four digital pixels DP may be formed by electrically connecting the first pixel circuits pxc11 to pxc41 and the second pixel circuits pxc12 to pxc42, respectively. For example, one digital pixel DP may be formed by electrically connecting the first pixel circuit pxc11 and the second pixel circuit pxc12.

In this case, the size, length, or pitch of one first pixel circuit (e.g., pxc11) belonging to the upper wafer WF-u may be equal to the size, length, or pitch of one second pixel circuit (e.g., pxc12) belonging to the lower wafer WF-d. In other words, the first pixel circuits pxc11 to pxc41 may be arranged to overlap the second pixel circuits pxc12 to pxc42, on a plane formed by the first and second directions DR1 and DR2.

As in the above description, each of the first pixel circuits pxc11 to pxc41 may include the photo detector PDT and a portion of the comparator COMP, and each of the second pixel circuits pxc12 to pxc42 may include the remaining portion of the comparator COMP and the memory circuit MCT. The second pixel circuits pxc12 to pxc42 may be formed in peripheral areas pra1 to pra4 and memory cell areas mea1 to mca4 of the lower wafer WF-D, respectively.

For example, the second pixel circuit pxc12 corresponding to the first pixel circuit pxc11 may be formed in the first peripheral area pra1 and the first memory cell area mca1, the second pixel circuit pxc22 corresponding to the first pixel circuit pxc21 may be formed in the second peripheral area pra2 and the second memory cell area mca2, the second pixel circuit pxc32 corresponding to the first pixel circuit pxc31 may be formed in the third peripheral area pra3 and the third memory cell area mca3, and the second pixel circuit pxc42 corresponding to the first pixel circuit pxc41 may be formed in the fourth peripheral area pra4 and the fourth memory cell area mca4.

Memory cells of the memory circuit MCT included in the second pixel circuit (e.g., pxc12) may be formed in the first memory cell area mca1, and the remaining components of the second pixel circuit (e.g., pxc12) may be formed in the first peripheral area pra1. In this case, the memory cells of the memory circuit MCT may be formed in the shape of an array in the first memory cell area mca1.

For example, as illustrated in FIG. 5B, a plurality of memory cells may be formed in the first memory cell area mca1. Some memory cells of the plurality of memory cells may be real memory cells RMC used to store real data or actual data (e.g., the reset sampling value "R" or the signal sampling value "S"), and the remaining memory cells may be dummy cells DC for guaranteeing the reliability of data stored in the real memory cells RMC. The dummy cells DC may be formed on a dummy pattern area DPA of the first memory cell area mca1.

For example, the real memory cells RMC may be connected with the first and second word lines WL1 and WL2 and the bit lines BL. As described with reference to FIGS.

3A to 3D, the real memory cells RMC connected to the first word line WL1 may be used to store the reset sampling value "R", and the real memory cells RMC connected to the second word line WL2 may be used to store the signal sampling value "S". As illustrated in FIG. 5B, the dummy cells DC may be formed in the first direction DR1, a direction facing away from the first direction DR1, the second direction DR2, and a direction facing away from the second direction DR2 with respect to an area, in which the real memory cells RMC are formed, of the first memory cell area mca1. In other words, memory cells placed in an edge area of the first memory cell area mca1 may be used as the dummy cells DC.

For brevity of illustration, the real memory cells RMC and the dummy cells DC are illustrated as being connected with the bit lines BL and the first and second word lines WL1 and WL2, but the inventive concept is not limited thereto. The real memory cells RMC may be electrically connected with the first and second word lines WL1 and WL2 and the bit lines BL and may be configured to store the digital signal DOUT. In contrast, the structure of the dummy cells DC may be similar to the structure of the real memory cells RMC, but the dummy cells DC may not be electrically connected with an external wire (e.g., a metal line).

The configuration of memory cells illustrated in FIG. 5B is exemplary, and the inventive concept is not limited thereto. For example, in the first memory cell area mca1, the total number of memory cells, the number of real memory cells, the number of dummy cells, the number of word lines, or the number of bit lines may be variously changed or modified.

In an exemplary embodiment of the inventive concept, the remaining memory cell areas (e.g., mca2, mca3, and mca4) may be similar in shape to the first memory cell area mca1. In this case, in the second pixel circuits pxc12 to pxc42, a pattern of memory cell areas may be identical to the pattern described with reference to FIG. 5C.

In this case, the size of the second pixel circuit (e.g., pxc12) may be "L1×L2", and the size of one memory area (e.g., mca1) may be "L3×L4". In this case, the size of a peripheral area (e.g., pra1) of the second pixel circuit (e.g., pxc12) may be "(L1×L2) (L3×L4)".

In an exemplary embodiment of the inventive concept, the first memory cell area mca1 illustrated in FIG. 5B may have a third length L3 in the first direction DR1 and may have a fourth length L4 in the second direction DR2. In the first memory cell area mca1, an area where the real memory cells RMC are placed may have a sixth length L6 in the first direction DR1 and may have an eighth length L8 in the second direction DR2. The dummy pattern area DPA may have fifth lengths L5 in the first direction DR1 and the direction facing away from the first direction DR1 with respect to the area where the real memory cells RMC are placed and seventh lengths L7 in the second direction DR2 and the direction facing away from the second direction DR2 with respect to the area where the real memory cells RMC are placed.

In other words, the total size of the first memory cell area mca1 may be "L3×L4", the size of the area, in which the real memory cells RMC are placed, of the first memory cell area mca1 may be "L6×L8", and the size of the dummy pattern area DPA may be "(L3×L4)−(L6×L8)".

As described above, the total size of the peripheral areas pra1, pra2, pra3, and pra4 may be limited due to the size of the dummy pattern area DPA of the memory cell area formed in each unit digital pixel DP. In this case, the reliability of components formed in the peripheral areas pra1 to pra4 may decrease due to the limited size of the peripheral areas pra1 to pr4. According to an exemplary embodiment of the inventive concept, in the memory area formed for each digital pixel DP, a dummy area may decrease by sharing a memory cell area and/or a dummy area which are adjacent to each other. The memory layout according to an exemplary embodiment of the inventive concept will be more fully described with reference to drawings below.

Figure 6:
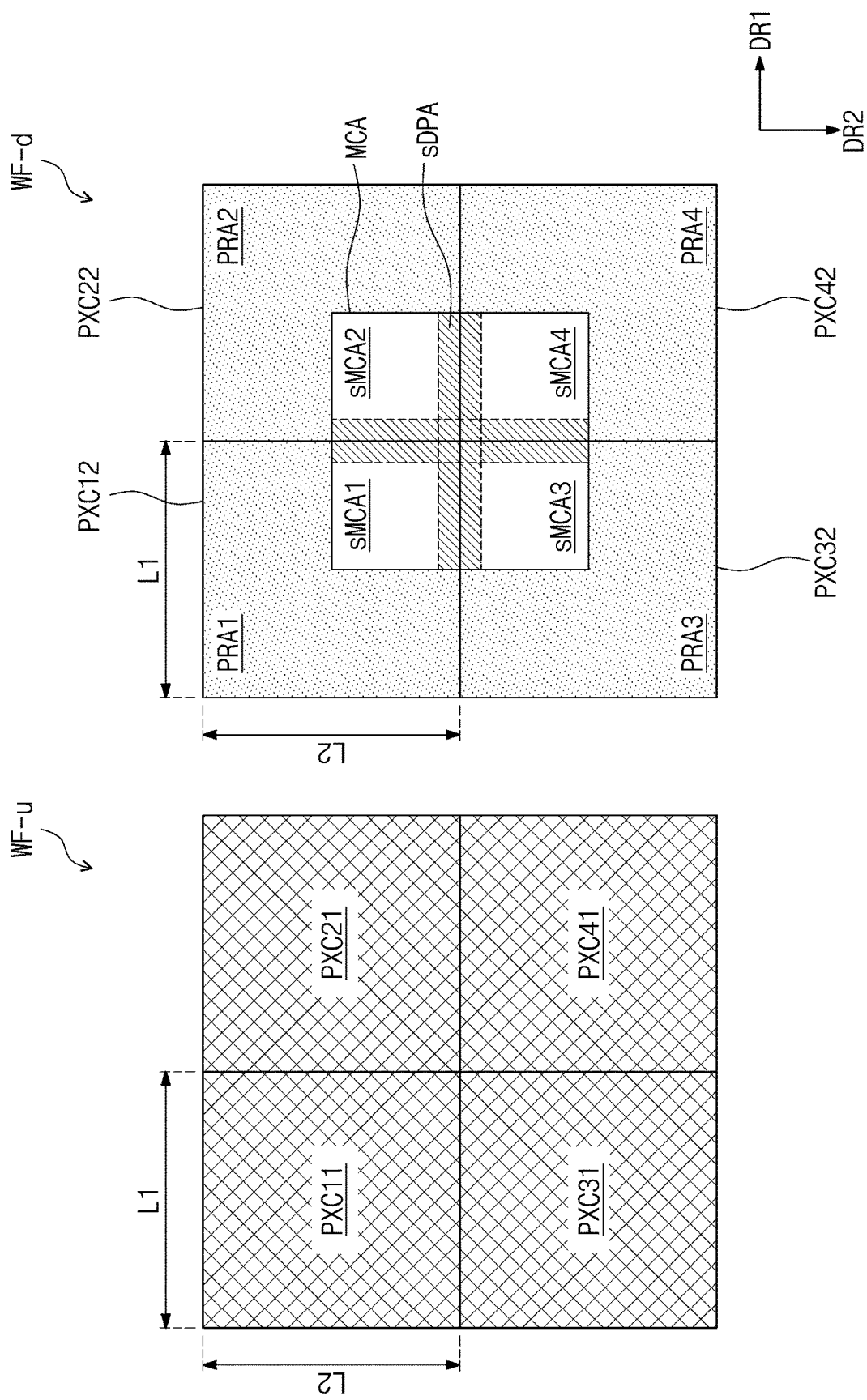
FIG. 6 is a plan view illustrating a layout of an upper wafer and a lower wafer of a pixel array illustrated in FIG. 4A.

FIG. 6 is a plan view illustrating a layout of an upper wafer and a lower wafer of a pixel array illustrated in FIG. 4A. Referring to FIGS. 4A and 6, the upper wafer WF-u may include the four first pixel circuits PXC11, PXC21, PXC31, and PXC41, and the first pixel circuits PXC11 to PXC41 may be arranged in the 2×2 matrix. The first pixel circuits PXC11 to PXC41 may be similar to those described above, and thus, additional description will be omitted to avoid redundancy.

The lower wafer WF-d may include the four second pixel circuits PXC12, PXC22, PXC32, and PXC42, and the second pixel circuits PXC12 to PXC42 may be arranged in the 2×2 matrix. As described above, each of the first pixel circuits PXC11 to PXC41 and the second pixel circuits PXC12 to PXC42 may have the size of "L1×L2", and the first pixel circuits PXC11 to PXC41 and the second pixel circuits PXC12 to PXC42 may be electrically connected to constitute four digital pixels DP. For example, the first pixel circuit PXC11 may be electrically connected to the second pixel circuit PXC12 to constitute a single digital pixel DP.

Unlike the second pixel circuits pxc12 to pxc42 of the lower wafer WF-d of FIG. 5A, the second pixel circuits PXC12 to PXC42 of the lower wafer WF-d of FIG. 6 may share one memory cell area MCA. For example, the second pixel circuits PXC12 to PXC42 of FIG. 5A include the different memory cell areas mca1 to mca4, respectively. In contrast, in the lower wafer WF-d of FIG. 6, memory cells may be formed in one memory cell area MCA, and the second pixel circuits PXC12 to PXC42 may share one memory cell area MCA.

For example, the memory cell area MCA may be divided into first, second, third and fourth sub memory cell areas sMCA1, sMCA2, sMCA3 and sMCA4 (hereinafter referred to as "sub areas"). In an exemplary embodiment, the first sub memory cell area sMCA1 may be located in the first peripheral area PRA1, the second sub memory cell area sMCA2 may be located in the second peripheral area PRA2, the third sub memory cell area sMCA2 may be located in the third peripheral area PRA3 and the fourth sub memory cell area sMCA4 may be located in the fourth peripheral area PRA4. Each of the first to fourth sub areas sMCA1 to sMCA4 may include the real memory cells RMC. The real memory cells RMC included in the first sub area sMCA1 may store a digital signal of a digital pixel DP formed by the pixel circuits PXC11 and PXC12. The real memory cells RMC included in the second sub area sMCA2 may store a digital signal of a digital pixel DP formed by the pixel circuits PXC21 and PXC22. The real memory cells RMC included in the third sub area sMCA3 may store a digital signal of a digital pixel DP formed by the pixel circuits PXC31 and PXC32. The real memory cells RMC included in the fourth sub area sMCA4 may store a digital signal of a digital pixel DP formed by the pixel circuits PXC41 and PXC42.

In an exemplary embodiment of the inventive concept, a shared dummy pattern area sDPA may be present between the first to fourth sub areas sMCA1 to sMCA4. The shared dummy pattern area sDPA may be a dummy pattern area shared by the first to fourth sub areas sMCA1 to sMCA4. For example, to guarantee the reliability of the real memory cells RMC of the first memory cell area mca1 of FIG. 5B, the dummy pattern area DPA is present in the edge area of the first memory cell area mca1. In other words, the dummy pattern area DPA surrounds the real memory cells RMC. In contrast, to guarantee the reliability of the real memory cells RMC of each of the first to fourth sub areas sMCA1 to sMCA4, the memory cell area MCA of FIG. 6 may include the shared dummy pattern area sDPA placed between the real memory cells RMC of the first to fourth sub areas sMCA1 to sMCA4. In other words, the first to fourth sub areas sMCA1 to sMCA4 may share a dummy pattern area (e.g., the shared dummy pattern area sDPA) placed in a particular area. In this case, compared with the embodiment of FIGS. 5A to 5C, because the dummy pattern area DPA (e.g., a dummy pattern area for the real memory cells RMC) used to form four digital pixels DP decreases, the size of the peripheral areas PRA1 to PRA4 may increase. As the size of the peripheral areas PRA1 to PRA4 increases, the reliability of components formed in the peripheral areas PRA1 to PRA4 may be increased, or components for another function may be additionally implemented.

Figure 7A:
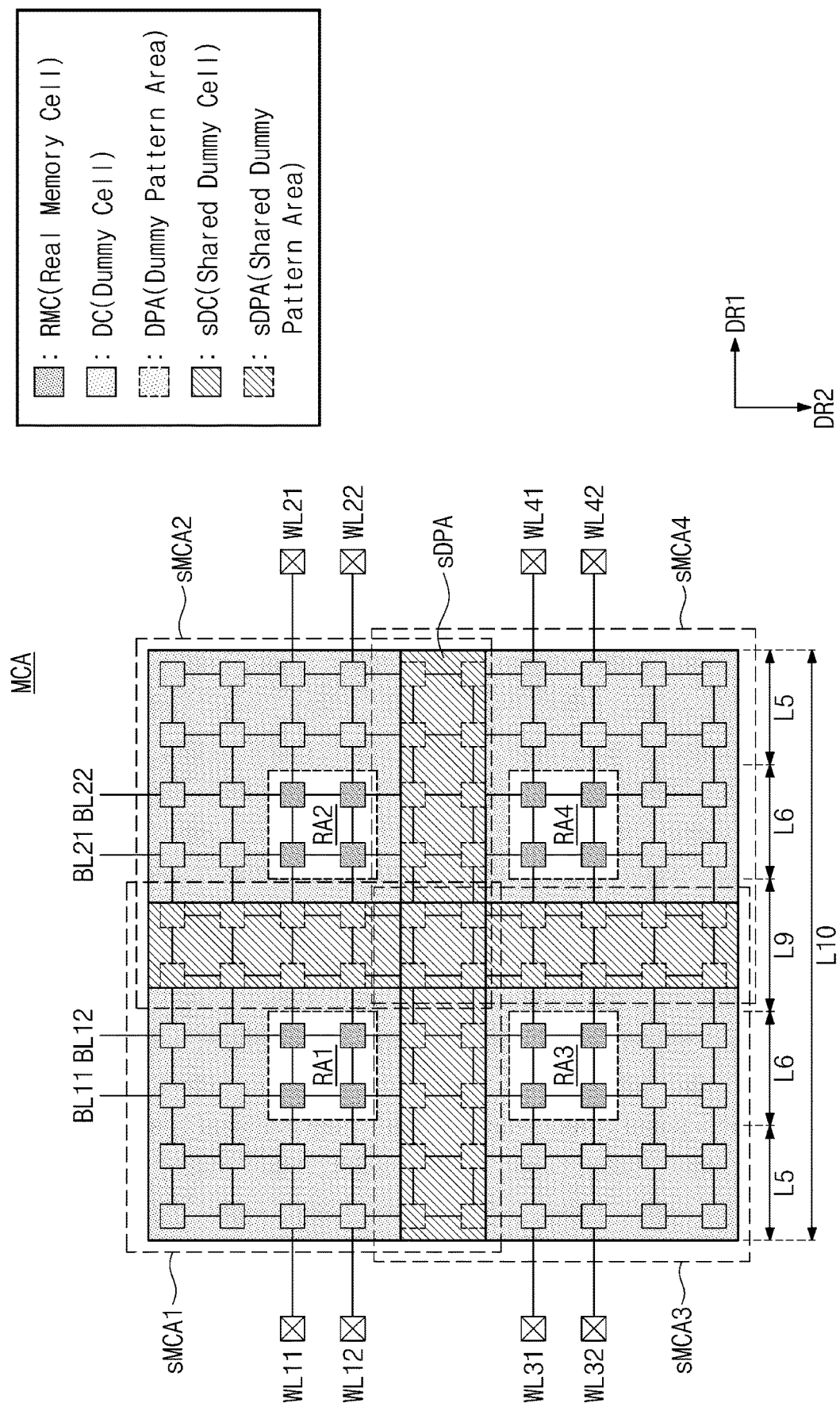
FIG. 7A is a plan view illustrating a layout of a memory cell area illustrated in FIG. 6.
Figure 7B:
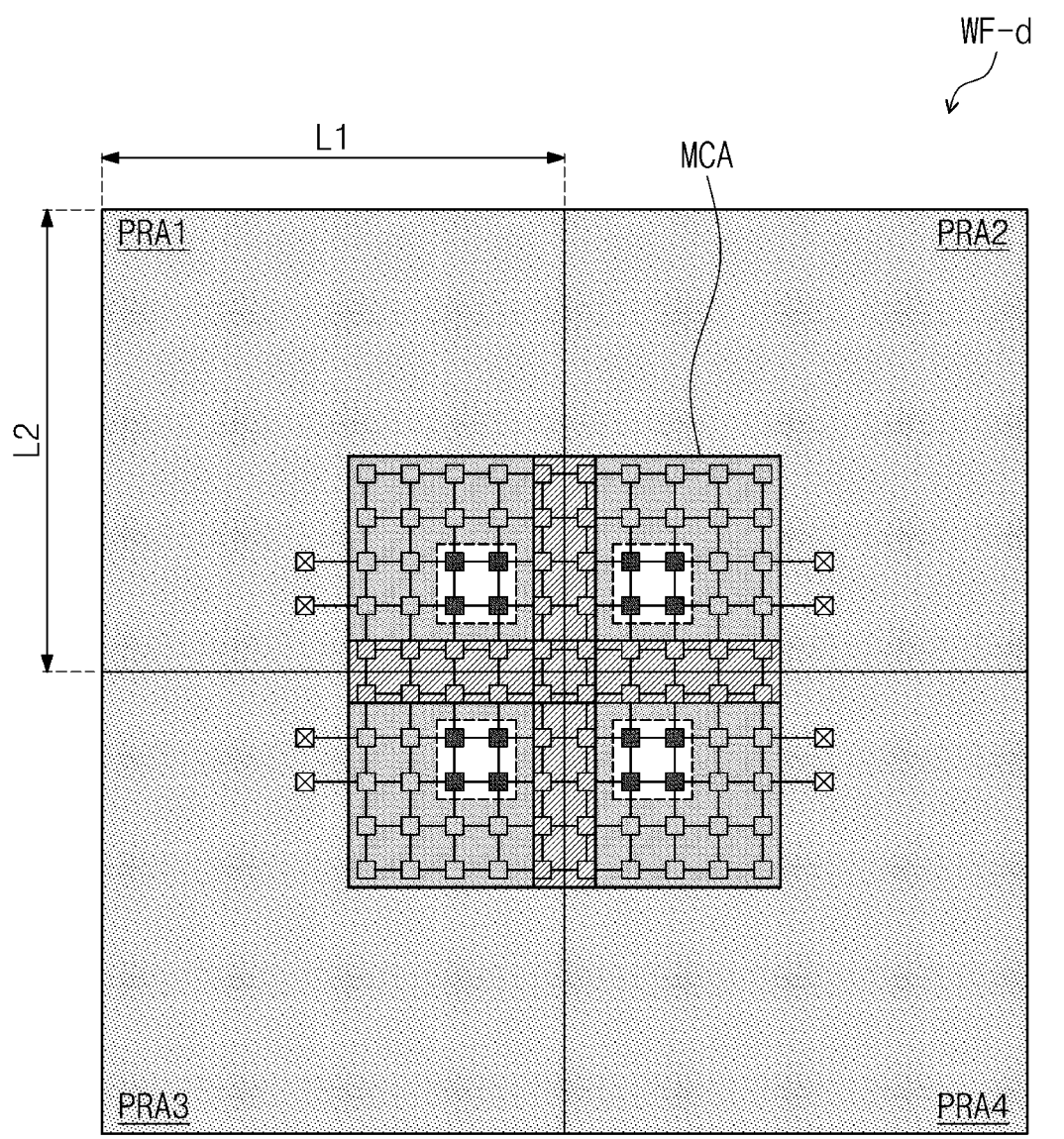
FIG. 7B is a plan view illustrating a lower wafer to which a memory cell area of FIG. 7A is applied.

FIG. 7A is a plan view illustrating a layout of a memory cell area illustrated in FIG. 6. FIG. 7B is a plan view illustrating a lower wafer to which a memory cell area of FIG. 7A is applied. In an exemplary embodiment of the inventive concept, the layouts of the memory cell area MCA illustrated in FIGS. 7A and 7B are exemplary, and the inventive concept is not limited thereto. For example, in the memory cell area MCA, the total number of memory cells, the number of real memory cells RMC, the number of dummy cells DC, or the number of shared dummy cells sDC may be variously changed or modified.

Referring to FIGS. 6 and 7A, the memory cell area MCA may include a plurality of memory cells. The plurality of memory cells may be arranged along a row direction (e.g., the first direction DR1) and a column direction (e.g., the second direction DR2) on the memory cell area MCA. Each of the plurality of memory cells may be connected with a bit line or a word line. Below, for convenience of description, an additional description associated with a word line or a bit line for the remaining memory cells (e.g., the dummy cells DC and the shared dummy cells sDC) other than the real memory cells RMC are omitted to avoid redundancy. However, the inventive concept is not limited thereto. For example, on the memory cell area MCA, a word line or a bit line corresponding to the remaining cells (e.g., the dummy cells DC and the shared dummy cells sDC) may be formed, but the word line or the bit line corresponding to the remaining cells (e.g., the dummy cells DC and the shared dummy cells sDC) may not be electrically connected with any other circuit (e.g., components of a peripheral area).

The plurality of memory cells may include the real memory cells RMC, the dummy cells DC, and the shared dummy cells sDC. The real memory cells RMC may store a corresponding digital signal (e.g., the reset sampling value "R" or the signal sampling value "S"). The dummy cells DC and the shared dummy cells sDC may be cells or a pattern for guaranteeing the reliability of the real memory cells RMC.

In an exemplary embodiment of the inventive concept, one memory cell area MCA may form one memory cell array or a single memory cell array. One memory cell array may indicate a structure in which adjacent memory cells or a pattern of memory cells is repeatedly formed within a particular area. For example, the embodiment of FIG. 5C is an embodiment in which a memory cell array is implemented in units of one digital pixel DP, and the embodiment of FIG. 6 is an embodiment in which a memory cell array is implemented in units of a plurality of digital pixels DP. In an exemplary embodiment of the inventive concept, a single memory cell array may indicate a set of memory cells or a structure surrounded by a dummy pattern area. In an exemplary embodiment of the inventive concept, only a repeated pattern such as a memory cell or a dummy cell may be included within a single memory cell array, and other additional components may be formed in a peripheral area outside the single memory cell.

The memory cell area MCA is divided into the first to fourth sub areas sMCA1 to sMCA4. Each of the first to fourth sub areas sMCA1 to sMCA4 may include the real memory cells RMC, the dummy cells DC, and the shared dummy cells sDC.

For example, the first sub area sMCA1 may include the real memory cells RMC in a first area RA1, a first portion of the dummy cells DC in the dummy pattern area DPA, and a first portion of the shared dummy cells sDC in the shared dummy pattern area sDPA. The real memory cells RMC in the first area RA1 may be connected with word lines WL11 and WL12 and bit lines BL11 and BL12 and may be configured to store the corresponding digital signal DOUT as described above. The first portion of the dummy cells DC in the dummy pattern area DPA of the first sub area sMCA1 may include dummy cells DC, which are on one side of the word line WL11 facing away from the second direction DR2 or on one side of the bit line BL1 facing away from the first direction DR1. The first portion of the shared dummy cells sDC in the shared dummy pattern area sDPA of the first sub area sMCA1 may include shared dummy cells sDC, which are on one side of the word line WL31 facing away from the second direction DR2 or on one side of the bit line BL21 facing away from the first direction DR1.

The second sub area sMCA2 may include the real memory cells RMC in a second area RA2, a second portion of the dummy cells DC in the dummy pattern area DPA, and a second portion of the shared dummy cells sDC in the shared dummy pattern area sDPA. The real memory cells RMC in the second area RA2 may be connected with word lines WL21 and WL22 and bit lines BL21 and BL22 and may be configured to store the corresponding digital signal DOUT as described above. The second portion of the dummy cells DC in the dummy pattern area DPA of the second sub area sMCA2 may include dummy cells DC, which are on one side of the word line WL21 facing away from the second direction DR2 or on one side of the bit line BL22 facing from the first direction DR1. The second portion of the shared dummy cells sDC in the shared dummy pattern area sDPA of the second sub area sMCA2 may include shared dummy cells sDC, which are on one side of a word line WL41 facing away from the second direction DR2 or on one side of the bit line BL12 facing the first direction DR1.

The third sub area sMCA3 may include the real memory cells RMC in a third area RA3, a third portion of the dummy cells DC in the dummy pattern area DPA, and a third portion of the shared dummy cells sDC in the shared dummy pattern area sDPA. The real memory cells RMC in the third area RA3 may be connected with word lines WL31 and WL32 and the bit lines BL11 and BL12 and may be configured to store the corresponding digital signal DOUT as described above. The third portion of the dummy cells DC in the dummy pattern area DPA of the third sub area sMCA3 may include dummy cells DC, which are on one side of the word line WL32 facing the second direction DR2 or on one side of the bit line BL11 facing away from the first direction DR1. The third portion of the shared dummy cells sDC in the shared dummy pattern area sDPA of the third sub area sMCA3 may include shared dummy cells sDC, which are on one side of the word line WL12 facing the second direction DR2 or on one side of the bit line BL21 facing away from the first direction DR1.

The fourth sub area sMCA4 may include the real memory cells RMC in a fourth area RA4, a fourth portion of the dummy cells DC in the dummy pattern area DPA, and a fourth portion of the shared dummy cells sDC in the shared dummy pattern area sDPA. The real memory cells RMC in the fourth area RA4 may be connected with word lines WL41 and WL42 and the bit lines BL21 and BL22 and may be configured to store the corresponding digital signal DOUT as described above. The fourth portion of the dummy cells DC in the dummy pattern area DPA of the fourth sub area sMCA4 may include dummy cells DC, which are on one side of the word line WL42 facing the second direction DR2 or on one side of the bit line BL22 facing the first direction DR1. The fourth portion of the shared dummy cells sDC in the shared dummy pattern area sDPA of the fourth sub area sMCA4 may include shared dummy cells sDC, which are on one side of the word line WL22 facing the second direction DR2 or on one side of the bit line BL12 facing the first direction DR1.

As described above, the first to fourth sub areas sMCA1 to sMCA4 may share the shared dummy cells sDC in the shared dummy pattern area sDPA. For example, in the embodiment of FIGS. 5B and 5C, two dummy pattern areas DPA may exist between real memory cells RMC of the first and second memory cell areas mca1 and mca2. In other words, in the case where a length (e.g., a length in the first direction DR1) of one dummy pattern area DPA is "L5", the real memory cells RMC of the first memory cell area mca1 and the real memory cells RMC of the second memory cell area mca2 may be spaced from each other as much as at least two times the length of "L5", and the dummy pattern area DPA, of which a length is "2×L5", may be present between the real memory cells RMC of the first memory cell area mca1 and the real memory cells RMC of the second memory cell area mca2.

In contrast, in the memory cell area MCA of FIG. 7A, only the shared dummy pattern area sDPA may be present between the first to fourth areas RA1 to RA4 where the real memory cells RMC are placed. For example, the first area RA1 and the second area RA2 may be spaced from each other as much as the shared dummy pattern area sDPA. In this case, the shared dummy pattern area sDPA may have a length of "L9" in the first direction DR1. In an exemplary embodiment of the inventive concept, the length of "L9" may be equal to "L5" being a length of one dummy pattern area DPA in the first direction DR1 or may be smaller than two times the length of "L5". In other words, compared with the embodiment of FIG. 5B or 5C, in the embodiment of FIG. 7A, a dummy pattern area DPA between adjacent real memory cells RMC may be decreased.

In an exemplary embodiment of the inventive concept, a portion of the dummy pattern area DPA corresponding to the decreased size may be used as a peripheral area. For example, referring to FIG. 7B, the lower wafer WF-d may include four second pixel circuits PXC12 to PXC42. As described above, the second pixel circuits PXC12 to PXC42 may share one memory cell area MCA, and thus, the size of the dummy pattern area DPA used in the memory cell area MCA may be decreased. For example, assume that the size of the area for the real memory cells RMC required for each of the second pixel circuits PXC12 to PXC42 is "L6×L6" (refer to FIG. 5B) and a length of the dummy pattern area DPA from the area for real memory cells is "L5" in the first direction DR1 and the and second direction DR2, respectively.

According to the embodiment of FIGS. 5B and 5C, the total size for the real memory cells RMC belonging to four digital pixels DP may be "4×(L6×L6)", and the total size of the dummy pattern area DPA may be "4×{(L5+L6+L5)×(L5+L6+L5)−(L6×L6)}". In other words, the total size of the memory cell area MCA including four digital pixels DP may be "4×(L3×L3)" (=4×(L6×L6)+4×{(L5+L6+L5)×(L5+L6+L5)−((L6×L6)})".

In contrast, according to the embodiment of FIGS. 7A and 7B, the total size of the area for the real memory cells RMC belonging to four digital pixels DP may be "4×(L6×L6)", and the total size of the dummy pattern area DPA may be "4×{(L5+L6+L9+L6+L9)2−4×(L6×L6)}". In other words, the total size of the memory cell area MCA including four digital pixels DP may be "L10×L10" (=4×(L6×L6)+4×{(L5+L6+L9+L6+L9)2−4×(L6×L6)})". In this case, "L10" may be smaller than two times the length of "L3".

As a result, according to an exemplary embodiment of the inventive concept, as a plurality of digital pixels share one memory cell area or memory cell areas of the plurality of digital pixels share different dummy pattern areas, the total size of the memory cell area may be decreased. A portion of the memory cell area corresponding to the decreased size may be utilized, and thus, the reliability of components formed in the peripheral area may increase or any other components for an additional function may be added.

In an exemplary embodiment of the inventive concept, as illustrated in FIGS. 7A and 7B, word lines connected with the real memory cells RMC may be connected with metal lines (refer to FIG. 4B) through word line contacts of the peripheral area.

For example, the word lines WL11 and WL12 connected with the real memory cells RMC of the first area RA may be connected with metal lines through word line contacts formed in the first peripheral area PRA1. The word lines WL21 and WL22 connected with the real memory cells RMC of the second area RA2 may be connected with metal lines through word line contacts formed in the second peripheral area PRA2. The word lines WL3 and WL32 connected with the real memory cells RMC of the third area RA3 may be connected with metal lines through word line contacts formed in the third peripheral area PRA3. The word lines WL41 and WL42 connected with the real memory cells RMC of the fourth area RA4 may be connected with metal lines through word line contacts formed in the fourth peripheral area PRA4. In an exemplary embodiment of the inventive concept, the metal lines connected with the plurality of word lines WL11 to WL42 may be connected with other components (e.g., the comparator COMP or the first selection circuit SEL1) formed in the corresponding peripheral areas PRA1 to PRA4 and may operate according to the operating method described above.

In an exemplary embodiment of the inventive concept, the bit lines BL11, BL12, BL21, and BL22 may be connected with metal lines through contacts formed in at least one of the peripheral areas PRA1 to PRA4. The metal lines connected with the bit lines BL11, BL12, BL21, and BL22 may be connected with other components (e.g., a counter, a sense amplifier, and a second selection circuit) formed in at least one of the peripheral areas PRA1 to PRA4.

As described above, according to an exemplary embodiment of the inventive concept, a plurality of digital pixels adjacent to each other may share one memory cell area (or a memory cell array) or may share a dummy pattern area. As such, the size of the dummy pattern area for guaranteeing the reliability of real memory cells used in a plurality of digital pixels may be decreased. Because a portion of the dummy pattern area corresponding to the decreased size is used as a peripheral area for forming other components, the reliability of components formed in the peripheral area may be increased, or components for adding any other function of a digital pixel may be further formed. Accordingly, there is provided an image sensor device with reduced costs, increased reliability, and increased performance.

FIG. 8 is a plan view illustrating a layout of a memory cell area of FIG. 6. For convenience of description, additional description associated with the above components will be omitted to avoid redundancy. In addition, for brevity of illustration, some of the above components may be omitted, or some reference symbols for describing the above components may be omitted. However, the inventive concept is not limited thereto, and the inventive concept may be understood in consideration of all the above embodiments, as well as the embodiment of FIG. 8.

Referring to FIGS. 6 and 8, as in the above description, a memory cell area MCA-a may be divided into the first to fourth sub areas sMCA1 and sMCA4. The real memory cells RMC included in the first sub area sMCA1 may be connected with the word lines WL11 and WL12 and the bit lines BL11 and BL12. The real memory cells RMC included in the second sub area sMCA2 may be connected with the word lines WL21 and WL22 and the bit lines BL21 and BL22. The real memory cells RMC included in the third sub area sMCA3 may be connected with the word lines WL31 and WL32 and the bit lines BL11 and BL12. The real memory cells RMC included in the fourth sub area sMCA4 may be connected with the word lines WL41 and WL42 and the bit lines BL21 and BL22.

The memory cell area MCA-a may include a plurality of memory cells. The plurality of memory cells may include the real memory cells RMC, the dummy cells DC, and the shared dummy cells sDC. The memory cell array MCA-a of FIG. 8 may further include shared dummy cells for isolation sDC-iso (hereinafter referred to as an "isolation cell").

The isolation cells sDC-iso may be dummy cells for separating word lines of the real memory cells RMC placed at the same row. For example, first and second digital pixels DP that are placed at the same row and are adjacent to each other may operate independently of each other. In other words, the first and second digital pixels DP may respectively store data at different timings depending on a light incident thereon. To accomplish this, memory cells corresponding to the first and second digital pixels DP may be controlled through separate signal lines (e.g., word lines).

In the embodiment of FIG. 8, it is assumed that the real memory cells RMC included in the first sub area sMCA1 correspond to the first digital pixel and the real memory cells RMC included in the second sub area sMCA2 correspond to the second digital pixel adjacent to the first digital pixel and belong to the same row as the first digital pixel. In this case, to implement independent operations of the first and second digital pixels, the real memory cells RMC included in the first sub area sMCA1 may be connected with the word lines WL11 and WL12, and the real memory cells RMC included in the second sub area sMCA2 may be connected with the word lines WL21 and WL22.

In this case, the real memory cells RMC included in the first sub area sMCA1 and the real memory cells RMC included in the second sub area sMCA2 may be placed at the same row at a level of a memory cell array. Because memory cells are formed in a repeated pattern, the real memory cells RMC included in the first sub area sMCA1 and the real memory cells RMC included in the second sub area sMCA2 may be connected to the same word line. To prevent connecting real memory cells RMC of different sub areas sMCA from being connected to the same word line, the isolation cells sDC-iso may be added between the real memory cells RMC included in the first sub area sMCA1 and the real memory cells RMC included in the second sub area sMCA2. The isolation cells sDC-iso may be some of the shared dummy cells sDC placed between the real memory cells RMC included in the first sub area sMCA1 and the second sub area sMCA2. The isolation cells sDC-iso may not be electrically connected with other cells (e.g., the shared dummy cells sDC) in the same row. For example, a word line pattern for the isolation cells sDC-iso may not be formed. In other words, the isolation cells sDC-iso may not be connected with a word line. In this case, the real memory cells RMC included in the first sub area sMCA1 and the real memory cells RMC included in the second sub area sMCA2 may be connected with different word lines, and thus, independent operations of the first and second digital pixels may be guaranteed.

The memory cell area MCA-a of FIG. 8 may further include additional isolation cells. The additional isolation cells may be placed between the real memory cells RMC of the first sub area sMCA1 and the real memory cells RMC of the third sub area sMCA3 or may be placed between the real memory cells RMC of the second sub area sMCA2 and the real memory cells RMC of the fourth sub area sMCA4, and thus, bit lines of respective sub areas may be separated from each other.

Figure 9:
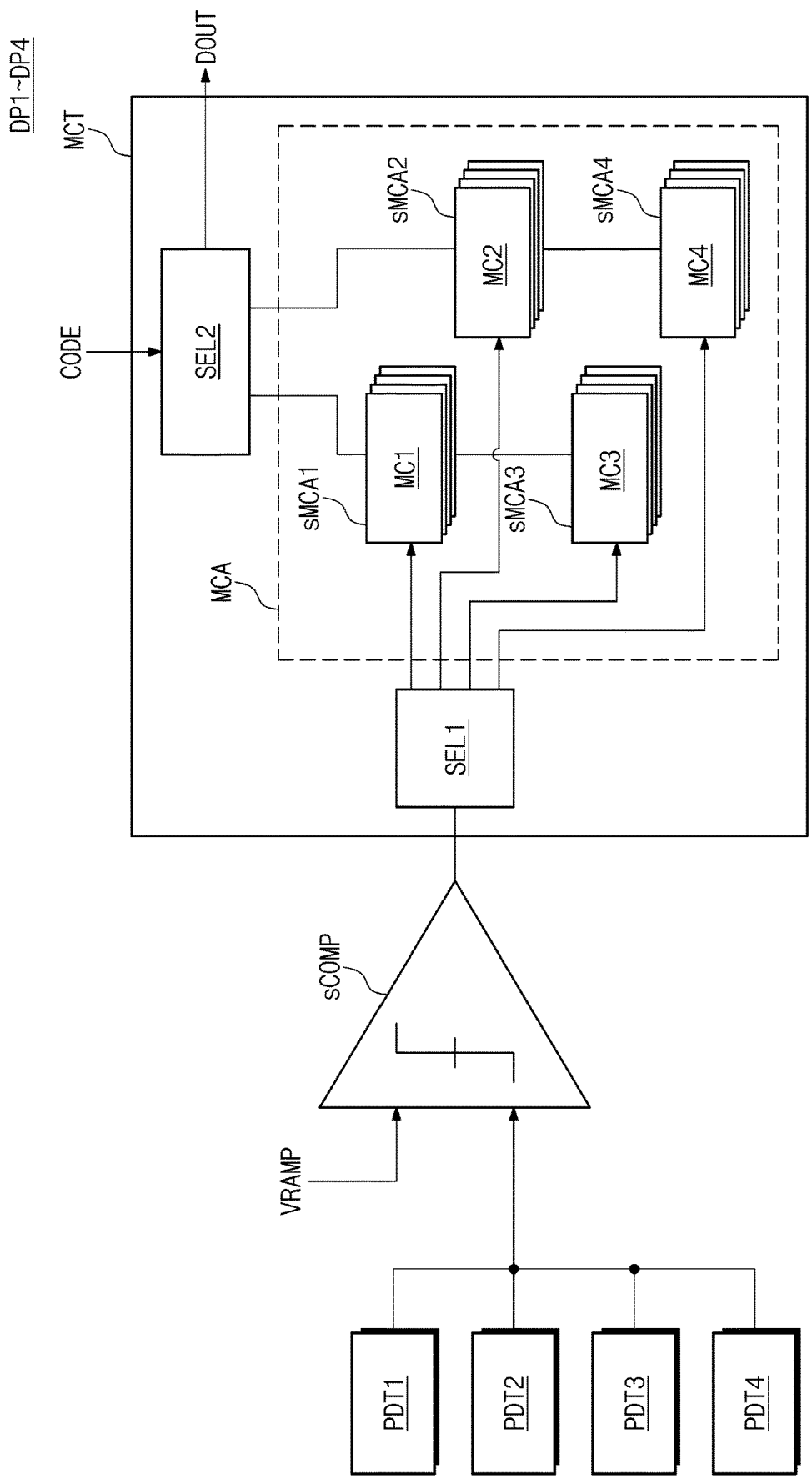
FIG. 9 is a diagram illustrating a structure in which digital pixels included in a pixel array of FIG. 1 share a comparator.

FIG. 9 is a diagram illustrating a structure in which digital pixels included in a pixel array of FIG. 1 share a comparator. Referring to FIGS. 1 and 9, four digital pixels DP1 to DP4 may share one comparator sCOMP (hereinafter referred to as "shared comparator").

For example, the first to fourth digital pixels DP1 to DP4 may include first to fourth photo detectors PDT1 to PDT4, one shared comparator sCOMP, and the memory circuit MCT. Each of the first to fourth photo detectors PDT1 to PDT4 is similar to the photo detector PDT described with reference to FIGS. 3A to 3D, and thus, additional description will be omitted to avoid redundancy. An output (e.g., the detection signal DET) of each of the first to fourth photo detectors PDT1 to PDT4 may be provided to the shared comparator sCOMP.

The shared comparator sCOMP may compare the output of each of the first to fourth photo detectors PDT1 to PDT4 and the ramp signal VRAMP and may output a comparison signal. In an exemplary embodiment of the inventive concept, the outputs of the first to fourth photo detectors PDT1 to PDT4 may be output at different timings, and thus, the shared comparator sCOMP may output the comparison signals respectively corresponding to the first to fourth photo detectors PDT1 to PDT4 at different timings.

The memory circuit MCT may store the code "CODE" corresponding to each of the first to fourth photo detectors PDT1 to PDT4 based on the comparison signal from the shared comparator sCOMP. For example, the memory circuit MCT may include the first selection circuit SEL1, the second selection circuit SEL2, first memory cells MC1, second memory cells MC2, third memory cells MC3, and fourth memory cells MC4.

When the comparison signal corresponding to the first photo detector PDT1 is output from the shared comparator sCOMP, the first selection circuit SEL1 may select a word line corresponding to the first memory cells MC1. When the comparison signal corresponding to the second photo detector PDT2 is output from the shared comparator sCOMP, the first selection circuit SEL1 may select a word line corresponding to the second memory cells MC2. When the comparison signal corresponding to the third photo detector PDT3 is output from the shared comparator sCOMP, the first selection circuit SEL1 may select a word line corresponding to the third memory cells MC3. When the comparison signal corresponding to the fourth photo detector PDT4 is output from the shared comparator sCOMP, the first selection circuit SEL1 may select a word line corresponding to the fourth memory cells MC4.

In other words, the first memory cells MC1 may be configured to store a digital signal corresponding to a light signal detected by the first photo detector PDT1, the second memory cells MC2 may be configured to store a digital signal corresponding to a light signal detected by the second photo detector PDT2, the third memory cells MC3 may be configured to store a digital signal corresponding to a light signal detected by the third photo detector PDT3, and the fourth memory cells MC4 may be configured to store a digital signal corresponding to a light signal detected by the fourth photo detector PDT4. As a result, the first photo detector PDT1, the shared comparator sCOMP, and the first memory cells MC1 may operate as the first digital pixel DP1; the second photo detector PDT2, the shared comparator sCOMP, and the second memory cells MC2 may operate as the second digital pixel DP2; the third photo detector PDT3, the shared comparator sCOMP, and the third memory cells MC3 may operate as the third digital pixel DP3; and the fourth photo detector PDT4, the shared comparator sCOMP, and the fourth memory cells MC4 may operate as the fourth digital pixel DP4. Each digital pixel is similar to that described with reference to FIGS. 3A to 3D except that a comparator is shared, and thus, additional description will be omitted to avoid redundancy.

In an exemplary embodiment of the inventive concept, an operating timing of the first to fourth photo detectors PDT1 to PDT4 and the memory circuit MCT may be controlled by the control signal CTRL (e.g., CS-PD or CS-MC) from the pixel driver 120.

In an exemplary embodiment of the inventive concept, the first to fourth photo detectors PDT1 to PDT4 may be respectively included in the first pixel circuits PXC11 to PXC41 of the upper wafer WF-u described with reference to FIG. 6. The first to fourth memory cells MC1 to MC4 may be respectively formed in the first to fourth sub areas sMCA1 to sMCA4 of the memory cell area MCA or MCA-a of the lower wafer WF-d described with reference to FIGS. 6 to 8.

In an exemplary embodiment of the inventive concept, the shared comparator sCOMP, the first selection circuit SEL1, and the second selection circuit SEL2 may be included in the first pixel circuits PXC11 to PXC41 of the upper wafer WF-u or the peripheral areas PR1 to PR4 of the lower wafer WF-d described with reference to FIGS. 6 to 8. In other words, one comparator may be formed at the upper wafer WF-u or the lower wafer WF-d in units of four digital pixels.

In an exemplary embodiment of the inventive concept, one memory cell area MCA (or a memory cell array) may be disposed in units of a pixel group including a plurality of digital pixels or may be disposed in units of a single comparator.

Figure 10A:
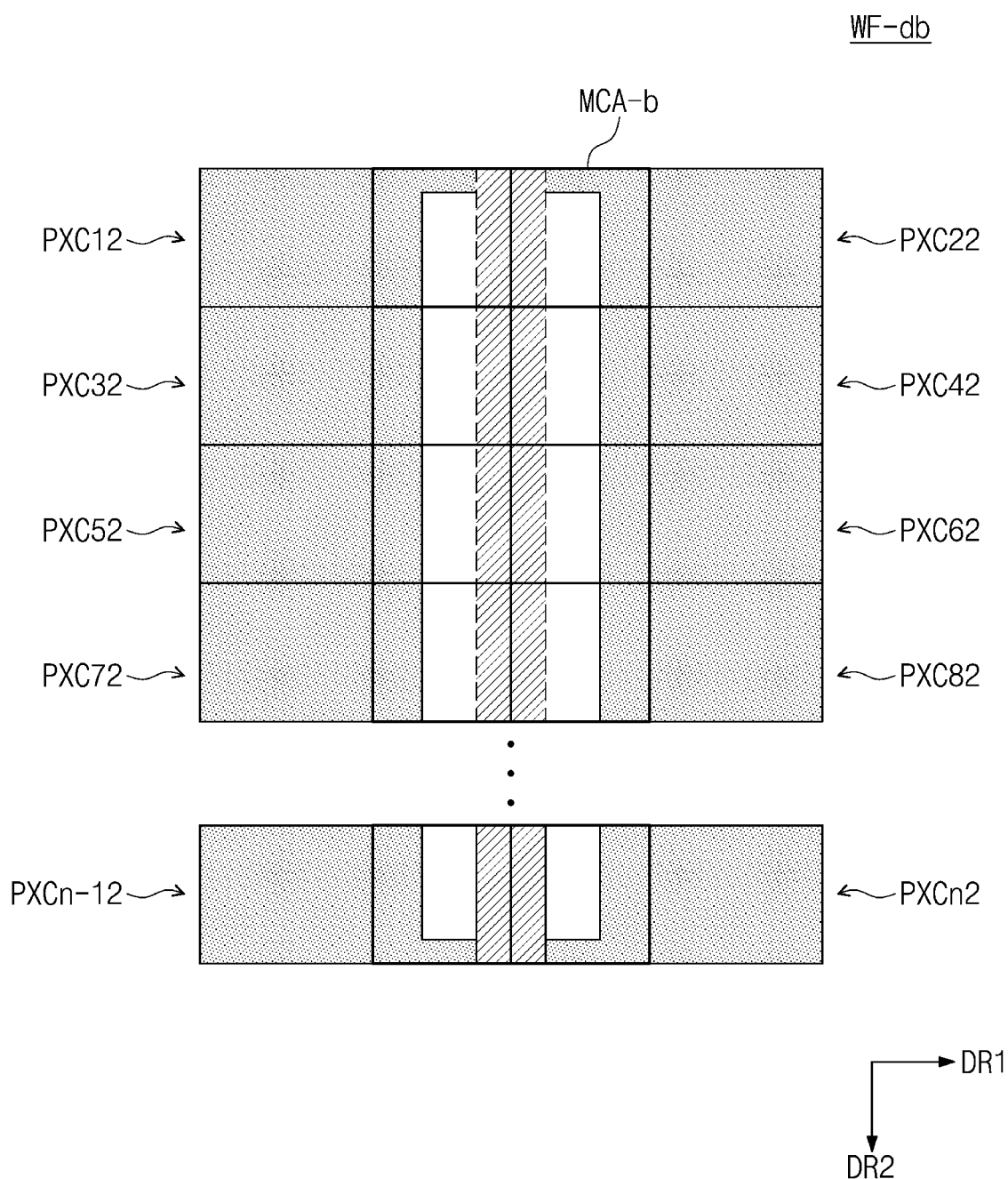
FIGS. 10A and 10B are plan views illustrating layouts of a lower wafer and a memory cell area of FIG. 4A.
Figure 10B:
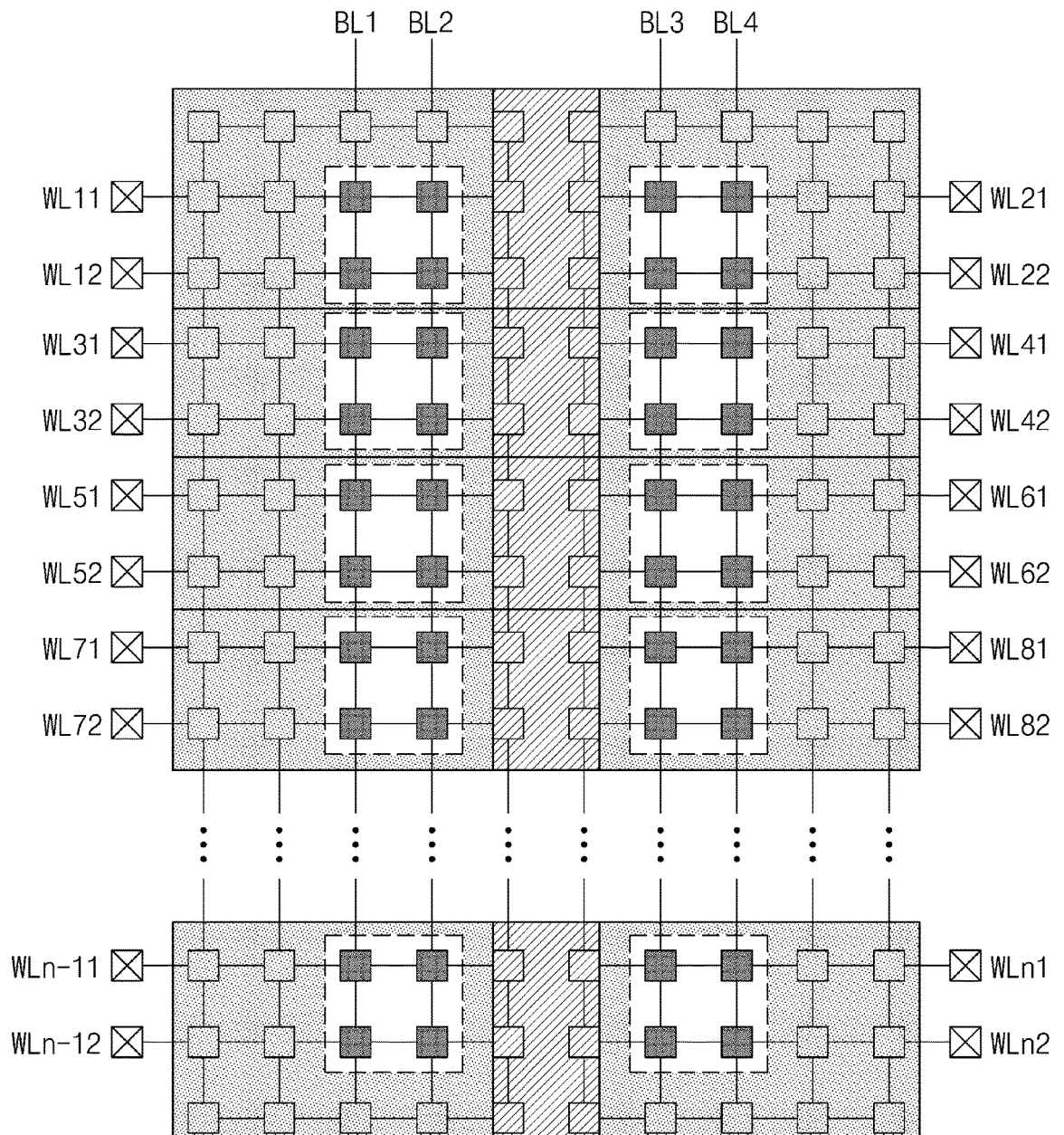

FIGS. 10A and 10B are plan views illustrating layouts of a lower wafer and a memory cell area of FIG. 4A. For brevity of illustration and for convenience of description, the description given with reference to the above components or reference symbols associated with the above components may be omitted to avoid redundancy. However, the inventive concept is not limited thereto, and the embodiment of FIGS. 10A and 10B may be understood in consideration of all the above embodiments or all embodiments to be described later.

Referring to FIGS. 10A and 10B, a lower wafer WF-db may include a plurality of second pixel circuits PXC12 to PXCn2. The plurality of second pixel circuits PXC12 to PXCn2 may be disposed along the second direction DR2 in pairs. For example, PXC12 and PXC22, PXC32 and PXC42, PXC52 and PXC62, PXC72 and PXC82 . . . PXCn-12 and PXCn2 may be respectively placed at the same rows, PXC12, PXC32, PXC52, PXC72 . . . PXCn-12 may be placed at the same column, and PXC22, PXC42, PXC62, PXC82 . . . PXCn2 may be placed at the same column.

The second pixel circuits PXC12, PXC32, PXC52, PXC72 . . . PXCn-12 in the same column (e.g., the first column) and the second pixel circuits PXC22, PXC42, PXC62, PXC82 . . . PXCn2 in the same column (e.g., the second column adjacent to the first column) may share one memory cell area MCA-b.

For example, as illustrated in FIG. 10B, the memory cell area MCA-b may include a plurality of memory cells, and the plurality of memory cells may include the real memory cells RMC, the dummy cells DC, and the shared dummy cells sDC.

In this case, the real memory cells RMC corresponding to the second pixel circuits PXC12, PXC32, PXC52, PXC72 . . . PXCn-12 in the same column (e.g., the first column) may be respectively connected with the corresponding word lines WL11 and WL12, WL31 and WL32, WL5 and WL52, WL71 and WL72 . . . WLn-11 and WLn-12. A word line may be connected with a metal line through a word line contact. The real memory cells RMC corresponding to the second pixel circuits PXC22, PXC42, PXC62, PXC82 . . . PXCn2 in the same column (e.g., the second column adjacent to the first column) may be respectively connected with the corresponding word lines WL21 and WL22, WL41 and WL42, WL61 and WL62, WL81 and WL82 . . . WLn1 and WLn2. A word line may be connected with a metal line through a word line contact.

The shared dummy memory cells sDC may be interposed between the real memory cells RMC corresponding to the second pixel circuits PXC12, PXC32, PXC52, PXC72 . . . PXCn-12 in the same column (e.g., the first column) and the real memory cells RMC corresponding to the second pixel circuits PXC22, PXC42, PXC62, PXC82 . . . PXCn2 in the same column (e.g., the second column). This configuration is similar to the configuration of the shared dummy cells sDC described above, and thus, additional description will be omitted to avoid redundancy.

Unlike the embodiment FIGS. 6A to 8, in the memory cell area MCA-b of FIG. 10B, the dummy cells DC or the dummy pattern area DPA between the real memory cells RMC adjacent along the second direction DR2 may be omitted. For example, the dummy cells DC, the dummy pattern area DPA, the shared dummy cells sDC, and the shared dummy pattern area sDPA between the real memory cells RMC (e.g., real memory cells associated with the word lines WL31 and WL32) corresponding to the pixel circuit PXC32 and the real memory cells RMC (e.g., real memory cells associated with the word lines WL51 and WL52) corresponding to the pixel circuit PXC52 may be omitted. In this case, two groups of real memory cells described above may be formed physically adjacent to each other. In other words, as the dummy pattern area DPA between the real memory cells RMC adjacent along the second direction DR2 is removed, the total size of the dummy pattern area may be decreased, and thus, the size of the peripheral area may be increased.

In an exemplary embodiment of the inventive concept, with regard to the real memory cells RMC corresponding to the second pixel circuits (e.g., PXC12, PXC22, PXCn-12, and PXCn2) placed in the edge area of the pixel array 110, the dummy cells DC or the dummy pattern area DPA may exist along the second direction DR2. For example, the dummy cells DC may be formed on one side of the real memory cells RMC corresponding to PXC12 (e.g., real memory cells connected with the word lines WL11 and WL12). For example, in FIG. 10B, the dummy cells DC of the second pixel circuit PXC12 are disposed to the left of the real memory cells RMC of the second pixel circuit PXC12. In addition, as in the above description, dummy cells may be formed in the remaining edge areas, and thus, additional description will be omitted to avoid redundancy. For example, in FIG. 10B, the dummy cells DC of the second pixel circuit PXC12 are disposed above the real memory cells RMC (e.g., facing away from the second direction DR2) of the second pixel circuit PXC12.

Figure 11A:
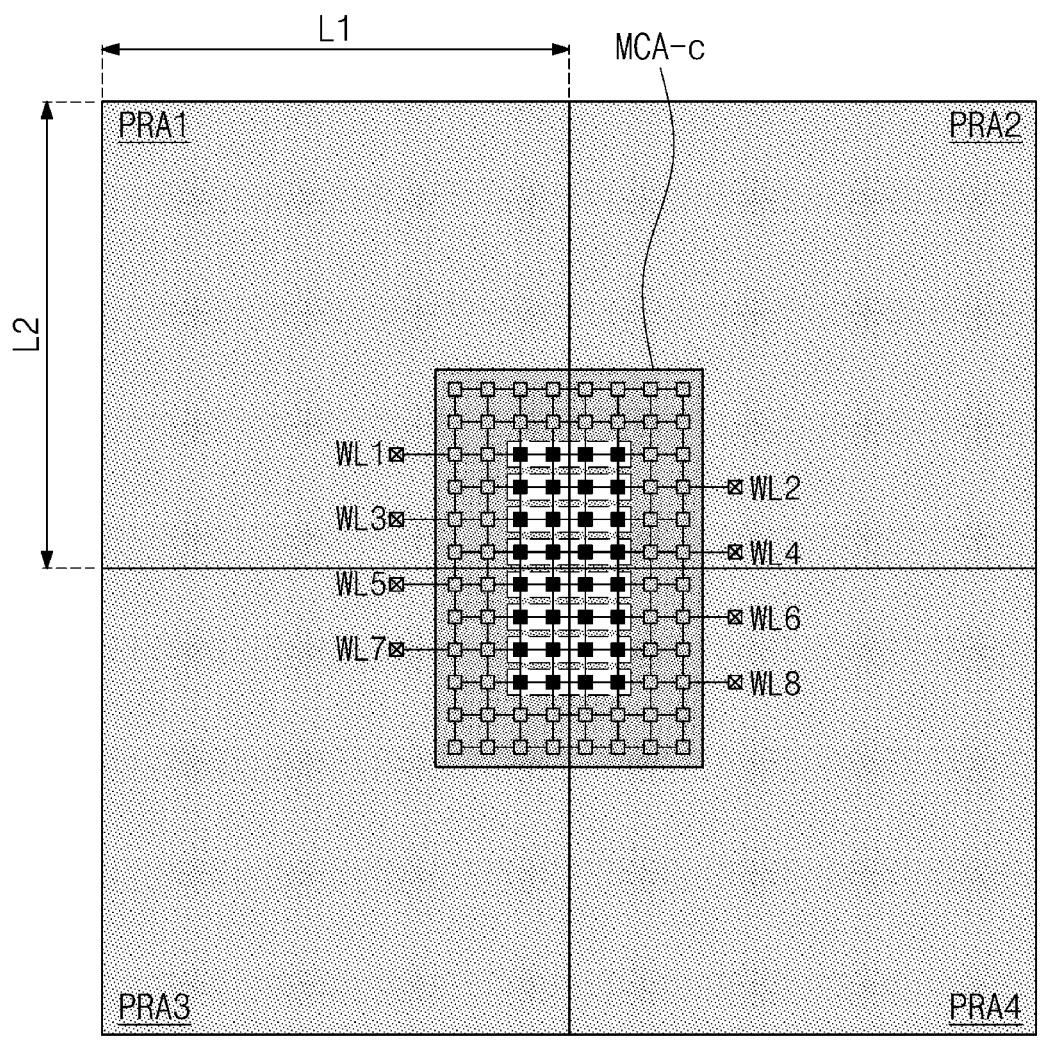
FIGS. 11A and 11B are plan views illustrating layouts of a lower wafer and a memory cell area of FIG. 4A.
Figure 11B:
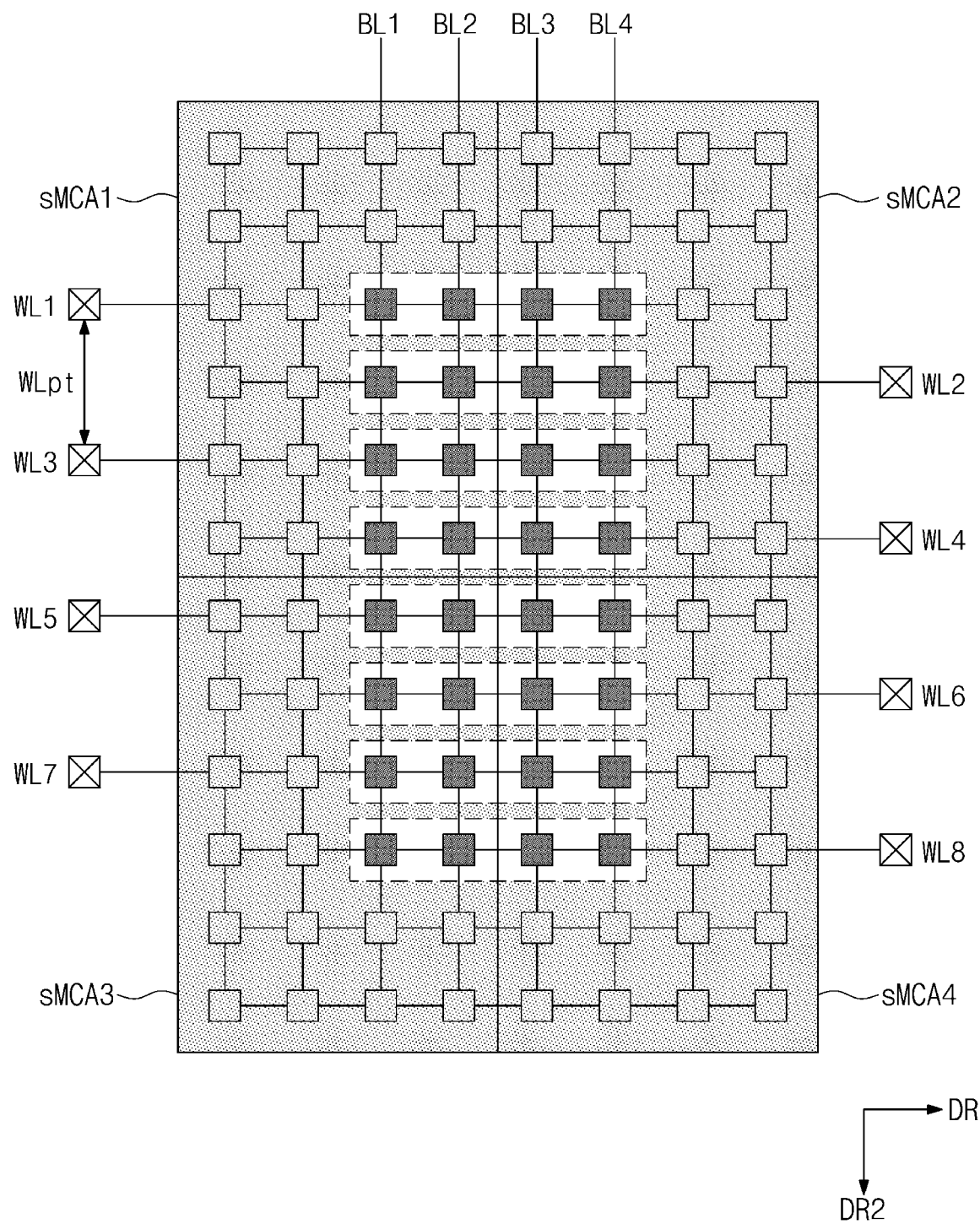

FIGS. 11A and 11B are plan views illustrating layouts of a lower wafer and a memory cell area of FIG. 4A. For brevity of illustration and for convenience of description, the description given with reference to the above components or reference symbols associated with the above components may be omitted to avoid redundancy. However, the inventive concept is not limited thereto.

Referring to FIGS. 11A and 11B, the lower wafer WF-dc may include the four second pixel circuits PXC12 to PXC42. The second pixel circuits PXC12 to PXC42 may share a memory cell area MCA-c.

The memory cell area MCA-c may include a plurality of memory cells. The plurality of memory cells may include the real memory cells RMC and the dummy cells DC. The memory cell area MCA-c is divided into the first to fourth sub areas sMCA1 to sMCA4.

In the embodiments described above, the real memory cells RMC included in each of the first to fourth sub areas sMCA1 to sMCA4 are configured to store a digital signal of the corresponding digital pixel. In contrast, the first to fourth sub areas sMCA1 to sMCA4 may be areas formed by dividing the memory cell area MCA-c of FIG. 11B in units of a digital pixel, and the real memory cells RMC included in each of the first to fourth sub areas sMCA1 to sMCA4 may be configured to store a digital signal of the corresponding digital pixel or to store a digital signal of an adjacent digital pixel.

For example, the real memory cells RMC included in the first sub area sMCA1 may be connected with first to fourth word lines WL1 to WL4 and may be connected with first and second bit lines BL1 and BL2. The real memory cells RMC included in the second sub area sMCA2 may be connected with the first to fourth word lines WL1 to WL4 and may be connected with third and fourth bit lines BL3 and BL4. The real memory cells RMC included in the third sub area sMCA3 may be connected with fifth to eighth word lines WL5 to WL8 and may be connected with the first and second bit lines BL1 and BL2. The real memory cells RMC included in the fourth sub area sMCA4 may be connected with the fifth to eighth word lines WL5 to WL8 and may be connected with the third and fourth bit lines BL3 and BL4.

In this case, the real memory cells RMC connected with the first and third word lines WL1 and WL3 may be configured to store a digital signal corresponding to a first digital pixel. The real memory cells RMC connected with the second and fourth word lines WL2 and WL4 may be configured to store a digital signal corresponding to a second digital pixel. In this case, the first digital pixel may be a digital pixel that includes a second pixel circuit where the first sub area sMCA1 is placed, and the second digital pixel may be a digital pixel that includes the second pixel circuit where the second sub area sMCA2 is placed. In other words, memory cells included in adjacent digital pixels may be configured to share the same bit lines. In other words, according to the embodiment of FIGS. 11A and 11B, real memory cells of digital pixels may have a structure sharing bit lines.

According to the above embodiment, the memory cells corresponding to the first digital pixel are connected with the first and third word lines WL1 and WL3, and the memory cells corresponding to the second digital pixel are connected with the second and fourth word lines WL2 and WL4. In other words, real memory cells that store a digital signal corresponding to digital pixels placed on one side thereof facing away from the first direction DR1 may be connected with an odd-numbered word line, and real memory cells that store a digital signal corresponding to digital pixels placed on one side thereof facing the first direction DR1 may be connected with an even-numbered word line.

The first and third word lines WL1 and WL3 may be connected with metal lines through word line contacts placed in the first peripheral area PRA1, and the second and fourth word lines WL2 and WL4 may be connected with metal lines through word line contacts placed in the second peripheral area PRA2. In this case, a distance (e.g., a word line pitch WLpt) between word line contacts formed in the same peripheral area may increase compared with the above embodiments. For example, in the embodiments described with reference to FIGS. 5A to 10B, word line contacts connected with adjacent word lines are successively formed in the same peripheral area. In contrast, in the embodiment of FIG. 11A, word line contacts connected with word lines (e.g., WL1 and WL3) not physically adjacent to each other are formed in the same peripheral area (e.g., PRA1).

In other words, because a distance (e.g., a word line pitch) between word line contacts formed along the second direction DR2, in other words, in one peripheral area increases, the complexity of a process for forming the word line contact or the complexity of the wires may be decreased.

According to the above embodiment, the memory cell area MCA-c included in the image sensor device 100 may include a plurality of memory cells. A plurality of memory cells may include a plurality of real memory cells connected with a plurality of bit lines. The real memory cells RMC, which are used to store a digital signal of the first digital pixel, from among the plurality of real memory cells may be connected with the first and third word lines WL1 and WL3. The real memory cells RMC that are used to store a digital signal of the second digital pixel physically adjacent to the first digital pixel may be connected with the second and fourth word lines WL2 and WL4. In this case, the second word line WL2 may be interposed between the first and third word lines WL1 and WL3, and the third word line WL3 may be interposed between the first and fourth word lines WL2 and WL4. In this case, word line contacts associated with the first and third word lines WL1 and WL3 may be formed in the first peripheral area PRA1, and word line contacts associated with the second and fourth word lines WL2 and WL4 may be formed in the second peripheral area PRA2. Therefore, a distance between word line contacts may increase, and thus, the complexity of a process for forming a word line contact may decrease.

In addition, as described above, according to the embodiment of FIGS. 11A and 11B, because the dummy cells or the dummy pattern area DPA does not exist between the real memory cells RMC, the total size of the memory cell area MCA-c may be decreased. A portion of the memory cell area MCA-c corresponding to the decreased size may be used to form the peripheral areas PRA1 to PRA4. Accordingly, an image sensor device with reduced costs, increased reliability, and increased performance is provided.

Figure 12:
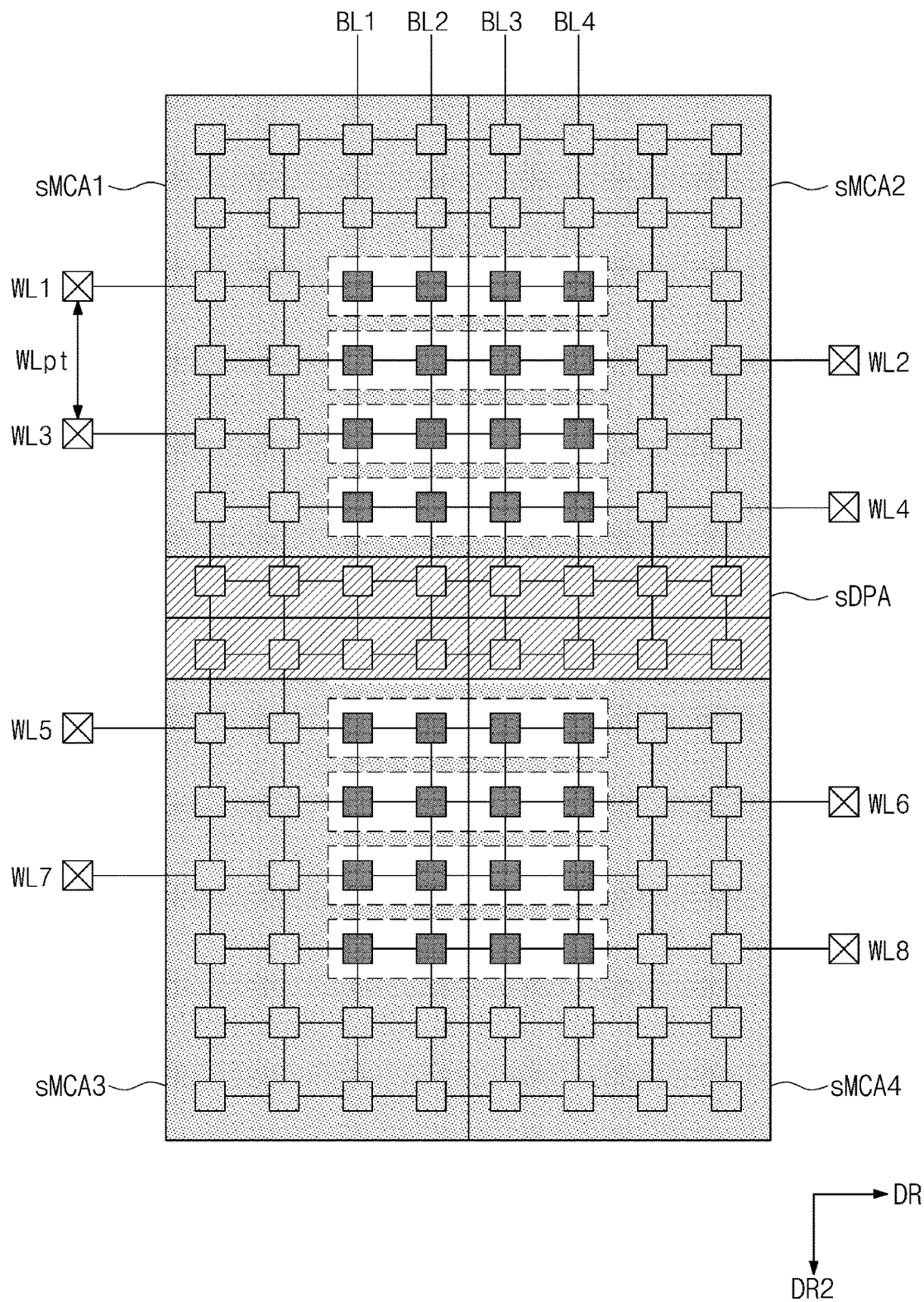
FIG. 12 is a plan view illustrating a memory cell area according to an exemplary embodiment of the inventive concept.

FIG. 12 is a plan view illustrating a memory cell area according to an exemplary embodiment of the inventive concept. For convenience of description, additional description associated with the above components may be omitted to avoid redundancy.

Referring to FIG. 12, a memory cell area MCA-d may include a plurality of memory cells, and the plurality of memory cells may include the real memory cells RMC, the dummy cells DC, and the shared dummy cells sDC. The memory cell area MCA-d is divided into the first to fourth sub areas sMCA1 to sMCA4. As in the above description, the memory cell area MCA-d may be a memory cell area shared by four digital pixels, and a configuration of the real memory cells RMC used by the four digital pixels may be similar to the configuration described with reference to FIGS. 11A and 11B. In other words, the real memory cells RMC of the memory cell area MCA-d may have a structure sharing the bit lines BL1 to BL4. In other words, the real memory cells RMC connected with the first and third word lines WL1 and WL3 and the first to fourth bit lines BL1 to BL4 may store a digital signal corresponding to a first digital pixel, and the real memory cells RMC connected with the second and fourth word lines WL2 and WL4 and the first to fourth bit lines BL1 to BL4 may store a digital signal corresponding to a second digital pixel. In this case, the first digital pixel and the second digital pixel may be digital pixels that are placed at the same row and are adjacent to each other, at a level of a pixel array.

Unlike the memory cell area MCA-c of FIGS. 11A and 11B, in the memory cell area MCA-d of FIG. 12, the shared dummy cells sDC or the shared dummy pattern area sDPA may exist between the real memory cells RMC arranged along the second direction DR2. For example, the shared dummy cells sDC or the shared dummy pattern area sDPA may exist between the real memory cells RMC in the first and second sub areas sMCA1 and sMCA2 and the real memory cells RMC in the third and fourth sub areas sMCA3 and sMCA4.

Figure 13:
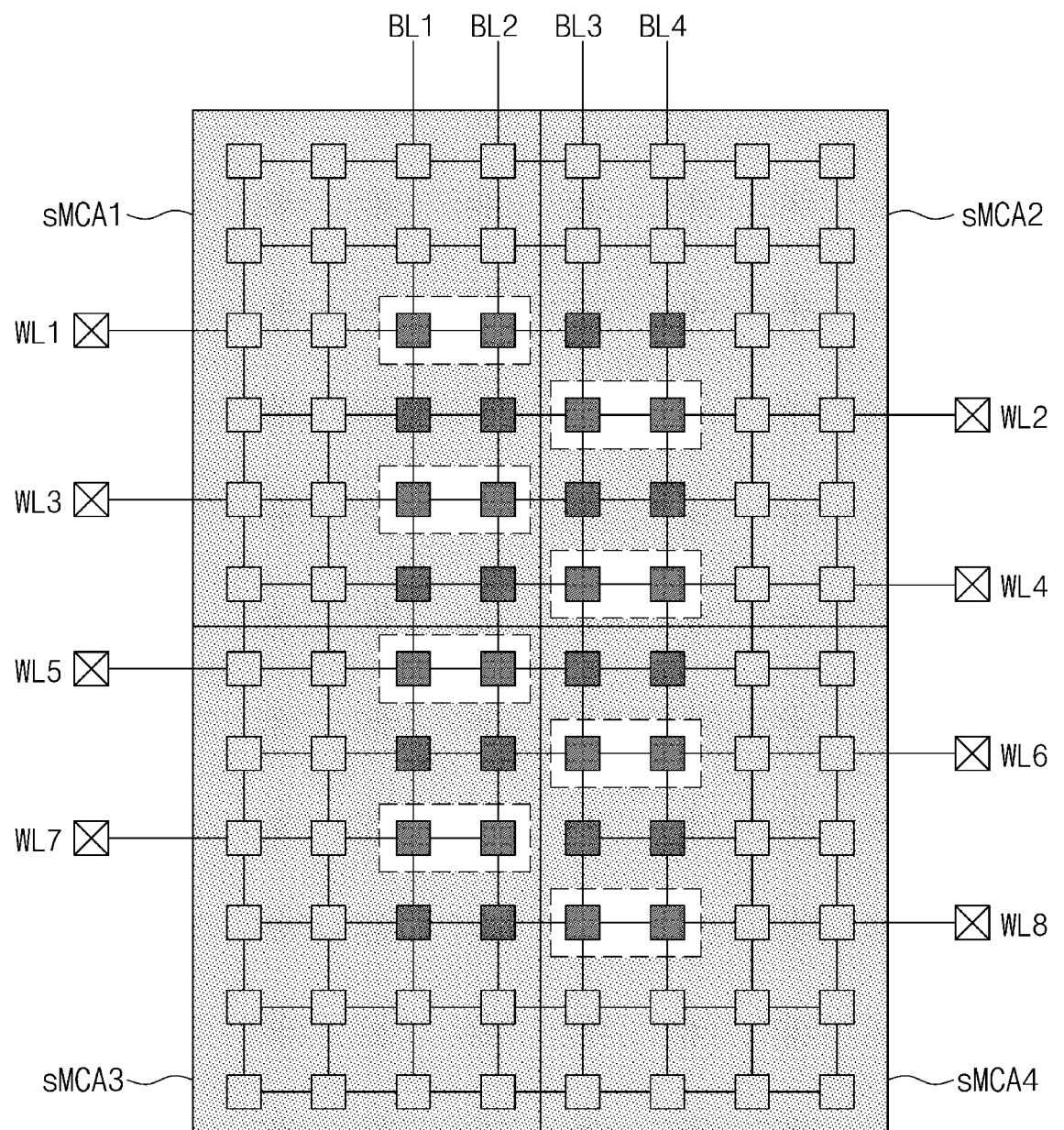
FIG. 13 is a plan view illustrating a memory cell area according to an exemplary embodiment of the inventive concept.

FIG. 13 is a plan view illustrating a memory cell area according to an exemplary embodiment of the inventive concept. For convenience of description, additional description associated with the above components may be omitted to avoid redundancy.

Referring to FIG. 13, a memory cell area MCA-e may include a plurality of memory cells, and the plurality of memory cells may include the real memory cells RMC, the dummy cells DC, and the shared dummy cells sDC. The memory cell area MCA-e is divided into the first to fourth sub areas sMCA1 to sMCA4.

In this case, the real memory cells RMC connected with the first and third word lines WL1 and WL3 and the first and second bit lines BL1 and BL2 may store a digital signal corresponding to a first digital pixel, and the real memory cells RMC connected with the second and fourth word lines WL2 and WL4 and the third and fourth bit lines BL3 and BL4 may store a digital signal corresponding to a second digital pixel. In this case, the first digital pixel and the second digital pixel may be digital pixels that are placed at the same row and are adjacent to each other, at a level of a pixel array. In other words, as described above, in the memory cell area MCA-e (or a memory cell array), real memory cells used at one digital pixel may be connected with word lines not adjacent to each other and may be included in a sub area corresponding to one digital pixel.

In addition, as in the above description given with reference to FIG. 7A or FIG. 8, the shared dummy cells sDC or the shared dummy pattern area sDPA may exist between the first to fourth sub areas sMCA1 to sMCA4 of the memory cell area MCA-e.

Figure 14A:
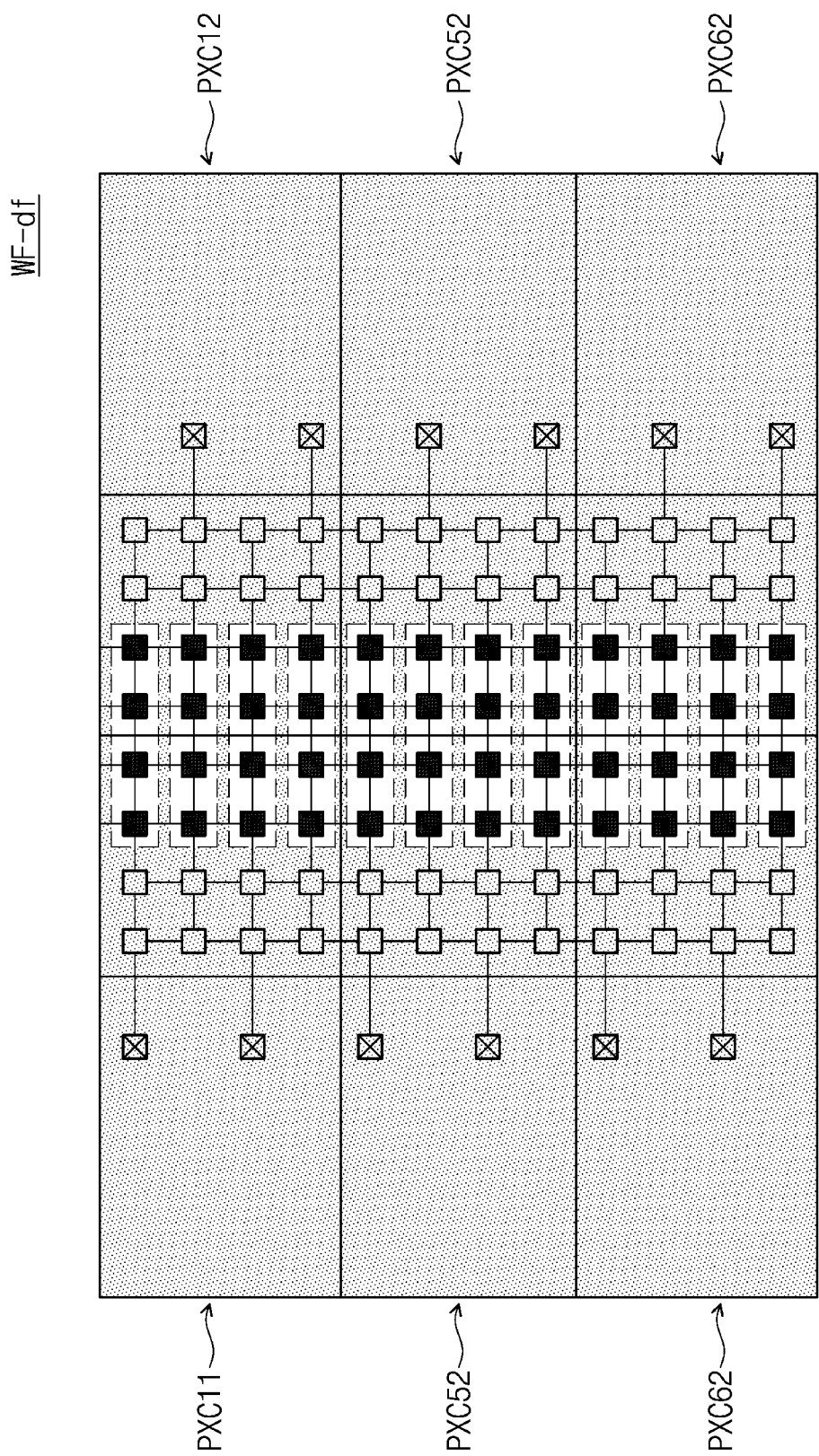
FIGS. 14A and 14B are plan views illustrating layouts of a lower wafer and a memory cell area according to an exemplary embodiment of the inventive concept.
Figure 14B:
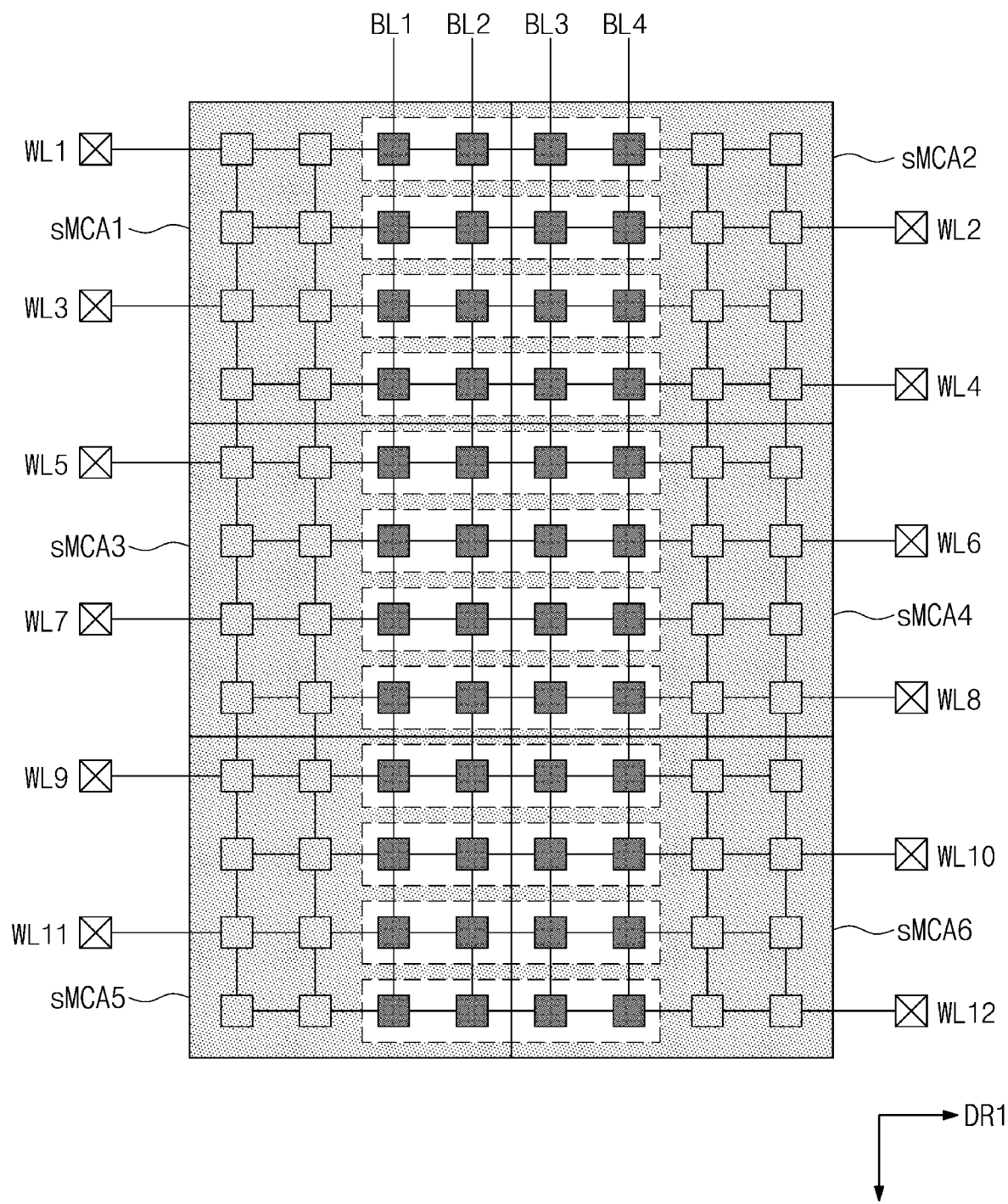

FIGS. 14A and 14B are plan views illustrating layouts of a lower wafer and a memory cell area according to an exemplary embodiment of the inventive concept. For convenience of description, additional description associated with the above components may be omitted to avoid redundancy.

Referring to FIGS. 14A and 14B, a lower wafer WF-df may include a plurality of second pixel circuits PXC12, PXC22, PXC32, PXC42, PXC52, and PXC62. The plurality of second pixel circuits PXC12 to PXC62 may share one memory cell area MCA-f.

The memory cell area MCA-f may include a plurality of memory cells, and the plurality of memory cells may include the real memory cells RMC and the dummy cells DC. As in the above description, the memory cell area MCA-f may be divided into a plurality of sub arrays sMCA1 to sMCA6. The real memory cells RMC of the memory cell area MCA-f may be connected with a plurality of word lines WL to WL12 and a plurality of bit lines BL1 to BL4. A correspondence relationship between the real memory cells RMC and a first digital pixel or a second digital pixel may be similar to that described with reference to FIGS. 11A and 11B. In other words, the real memory cells RMC of the memory cell area MCA-f may have a structure sharing a bit line. This is described above, and thus, additional description may be omitted to avoid redundancy.

Unlike the description given above, in the memory cell area MCA-f of FIGS. 14A and 14B, the dummy cells DC or the shared dummy cells sDC may not exist between the real memory cells RMC arranged along the second direction DR2. A configuration that the dummy cells DC or the shared dummy cells sDC do not exist between the real memory cells RMC arranged along the second direction DR2 is described with reference to FIGS. 10A and 10B, and thus, additional description will be omitted to avoid redundancy.

In addition, as in the above description given with reference to FIGS. 10A and 10B, a sub area associated with a second pixel circuit placed in an edge area of the lower wafer WF-df may include the dummy cells DC placed on one side thereof facing the second direction DR2 or facing away from the second direction DR2. This is described with reference to FIGS. 10A and 10B, and thus, additional description will be omitted to avoid redundancy.

Figure 15A:
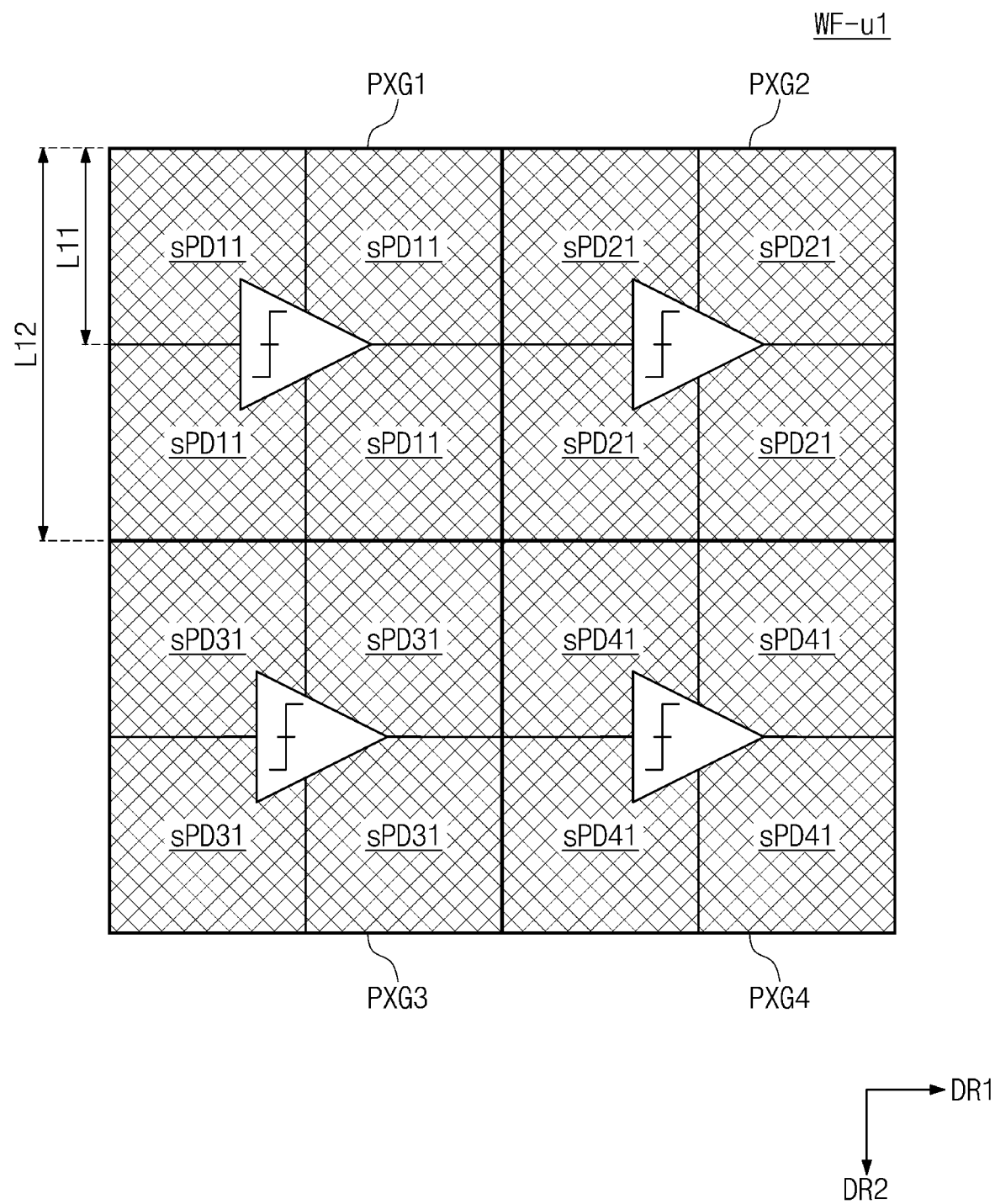
FIGS. 15A and 15B are plan views illustrating layouts of an upper wafer and a lower wafer of an image sensor device according to an exemplary embodiment of the inventive concept.
Figure 15B:
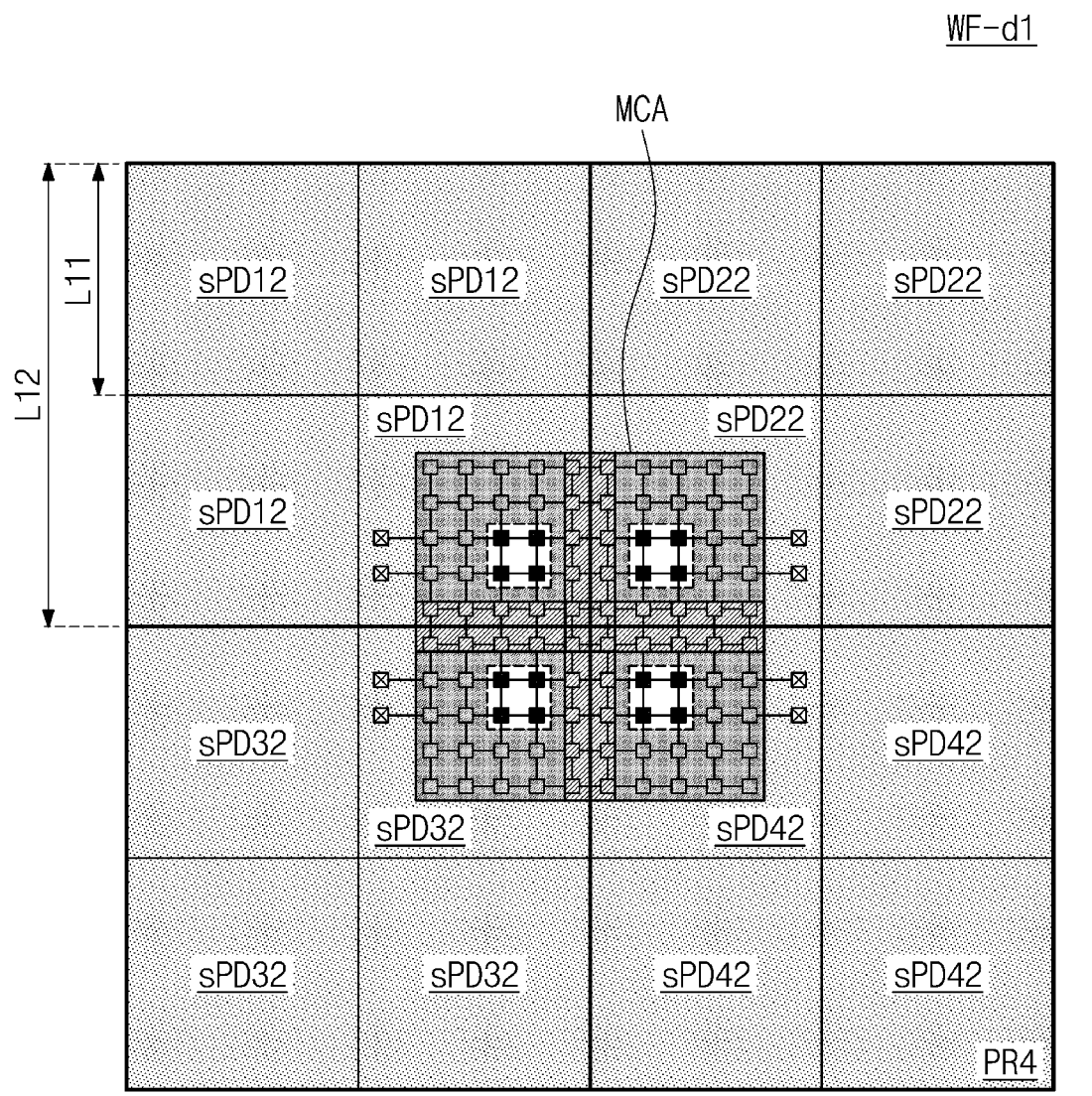

FIGS. 15A and 15B are plan views illustrating layouts of an upper wafer and a lower wafer of an image sensor device according to an exemplary embodiment of the inventive concept. For convenience of description, additional description associated with the above components may be omitted to avoid redundancy. Referring to FIGS. 15A and 15B, an upper wafer WF-u1 may include a plurality of first sub pixel circuits sPD11, sPD21, sPD31 and sPD41. Each of the plurality of first sub pixel circuits sPD11 to sPD41 may include a photo detector or a photo diode configured to detect a light incident from the outside. For example, each of the plurality of first sub pixel circuits sPD11 to sPD41 may include the photo detector PDT or the photo diode PD described with reference to FIGS. 3A to 3D. The plurality of first sub pixel circuits sPD11 to sPD41 may be arranged along the row direction (e.g., the first direction DR1) and the column direction (e.g., the second direction DR2).

In an exemplary embodiment of the inventive concept, photo detectors or photo diodes included in the same pixel group may be configured to detect a light of the same color. For example, the plurality of first sub pixel circuits sPD11 included in a first pixel group PXG1 may be configured to detect a light of a first color (e.g., green (G)), the plurality of second sub pixel circuits sPD21 included in a second pixel group PXG2 may be configured to detect a light of a second color (e.g., red (R)), the plurality of third sub pixel circuits sPD31 included in a third pixel group PXG3 may be configured to detect a light of a third color (e.g., blue (B)), and the plurality of fourth sub pixel circuits sPD41 included in a fourth pixel group PXG4 may be configured to detect a light of the first color (e.g., green (G)). However, the inventive concept is not limited thereto. For various detection patterns, various patterns of color filter arrays may be formed on a plurality of sub pixel circuits.

A lower wafer WF-dl may include a plurality of second pixel circuits sPD12, sPD22, sPD32, and sPD42. The plurality of second pixel circuits sPD12, sPD22, sPD32, and sPD42 may be arranged to overlap the plurality of first sub pixel circuits sPD1 to sPD41 of the upper wafer WF-u1. For example, the first sub pixel circuits (e.g., sPD11) may be arranged to overlap the second sub pixel circuits (e.g., sPD12), respectively. The remaining second sub pixel circuits sPD22 to sPD42 are arranged to be similar to those described above, and thus, additional description will be omitted to avoid redundancy.

The plurality of first sub pixel circuits sPD11 to sPD41 and the plurality of second sub pixel circuits sPD12 to sPD42 may be classified into a plurality of pixel groups PXG1 to PXG4. For example, the four first sub pixel circuits sPD11 and the four second sub pixel circuits sPD12 may form the first pixel group PXG1. The first pixel group PXG1 may operate as one digital pixel DP described with reference to FIGS. 3A to 3D. In other words, detection signals or light signals from the four photo detectors PDT or the four photo diodes PD may be combined to one signal, and one comparison signal corresponding to the four first sub pixel circuits sPD11 may be output through one comparator COMP. In this case, a set of digital signals corresponding to the four first sub pixel circuits sPD11 may be stored in the memory circuit MCT. The remaining sub pixel circuits sPD21 to sPD41 and the remaining pixel groups PXG2 to PXG4 are also similar those described above, and thus, additional description will be omitted to avoid redundancy.

In FIGS. 15A and 15B, the size or pitch of each of the first sub pixel circuit (e.g., sPD1) and the second sub pixel circuit (e.g., sPD12) may be "L11". The size or pitch of one pixel group (e.g., PXG1) may be "L12". As described above, because four sub pixel circuits constitute one pixel group and one comparator is used for each pixel group, the size or pitch of the one comparator may be equal to "L12" which is the size or pitch of the one pixel group.

In other words, a plurality of photo detectors or a plurality of photo diodes may be included in one pixel group operating as one digital pixel, and one pixel group may include one comparator and one memory circuit. One comparator may be formed at second sub pixel circuits (e.g., four sub pixel circuits sPD12) of the lower wafer WF-dl. Alternatively, a portion of one comparator may be formed in an area of first sub pixel circuits (e.g., four sub pixel circuits sPD11) of the upper wafer WF-u1, and the remaining portion thereof may be formed at second sub pixel circuits (e.g., four sub pixel circuits sPD12) of the lower wafer WF-dl.

In an exemplary embodiment of the inventive concept, the four pixel groups PXG1 to PXG4 may share a memory cell area MCA. For example, because each of the four pixel groups PXG1 to PXG4 operates as one digital pixel, each of the four pixel groups PXG1 to PXG4 may use a set of real memory cells RMC. In this case, as described with reference to FIGS. 1 to 14B, four sets of real memory cells RMC may be included in one memory cell area MCA-1, and the four pixel groups PXG1 to PXG4 may share one memory cell area MCA-1. An example of a portion (the 'portion' being similar in structure to the memory cell area MCA of FIG. 7A) of the memory cell area MCA-1 is illustrated in FIG. 15B, but the inventive concept is not limited thereto. For example, the memory cell area MCA-1 may be implemented in the shape of respective memory cell areas having various structure or layouts described above or in the shape of a combination thereof.

As described above, according to an exemplary embodiment of the inventive concept, an image sensor device may include a plurality of digital pixels. Each of the plurality of digital pixels may use memory cells for storing a digital signal. In this case, according to an exemplary embodiment of the inventive concept, at least two adjacent digital pixels may share one memory cell area. As such, the size of a dummy pattern area formed in the memory cell area may be decreased, and a portion of the dummy pattern area corresponding to the decreased size may be used as a peripheral area for forming any other components. In other words, the reliability of components formed in the peripheral area may be increased, or components for any other additional function may be further added. Accordingly, an image sensor device with reduced costs, increased reliability, and improved performance is provided.

Figure 16A:
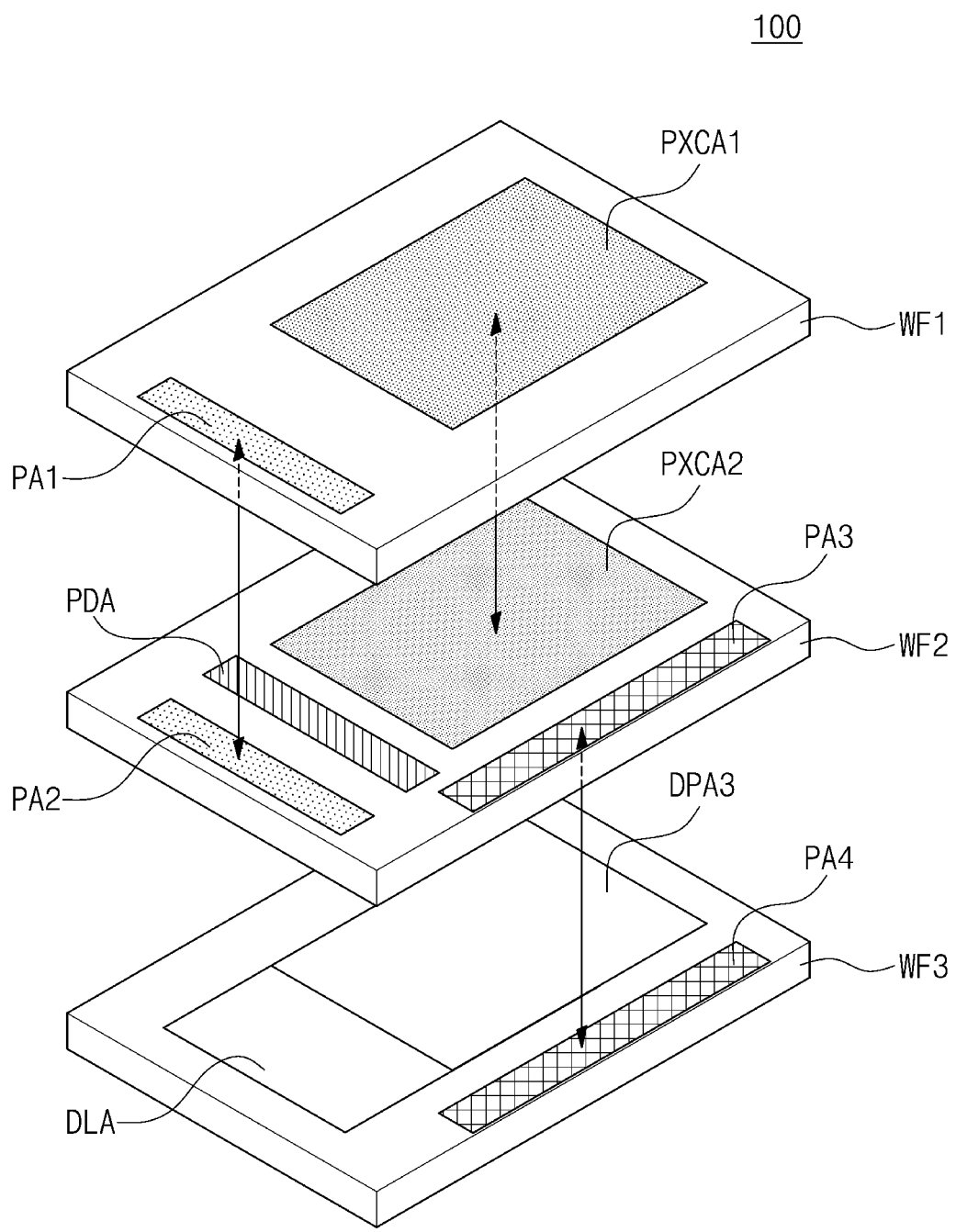
FIG. 16A is a perspective view illustrating an image sensor device of FIG. 1.
Figure 16B:
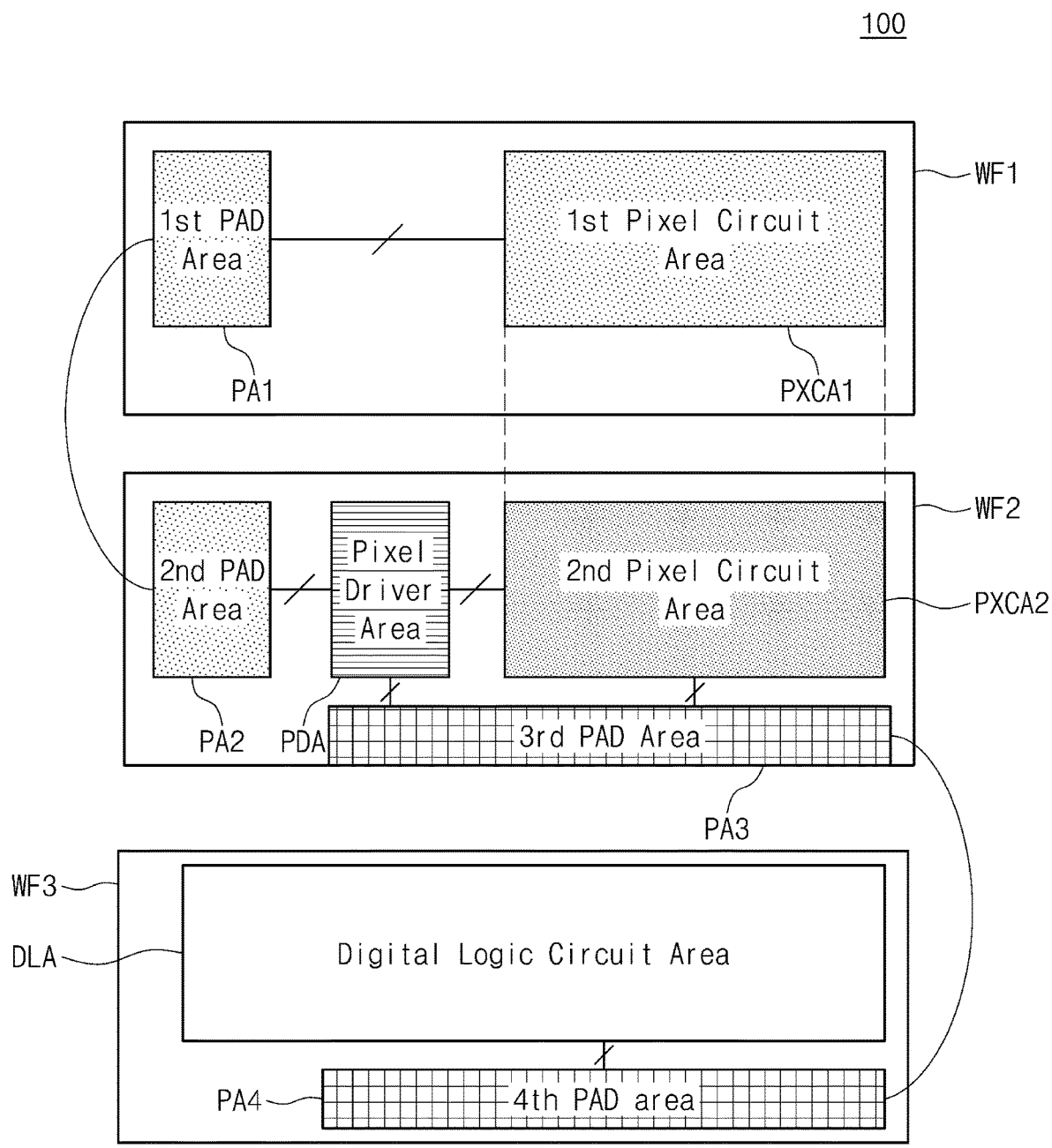
FIG. 16B is a plan view illustrating an image sensor device of FIG. 1.

FIG. 16A is a perspective view illustrating an image sensor device of FIG. 1, and FIG. 16B is a plan view illustrating an image sensor device of FIG. 1. An example of the image sensor device 100 according to an exemplary embodiment of the inventive concept will be described with reference to FIGS. 16A and 16B in terms of a physical structure. In other words, in the following description, the inventive concept will be described with reference to semiconductor wafers included in the image sensor device 100. To describe the inventive concept easily, components illustrated in FIGS. 16A and 16B are schematically illustrated unlike a semiconductor wafer, a semiconductor chip, a semiconductor die, or a semiconductor package implemented in practice.

Referring to FIGS. 1, 16A, and 16B, the image sensor device 100 may include first, second and third semiconductor wafers WF1, WF2 and WF3. The first to third semiconductor wafers WF1 to WF3 may be manufactured through different semiconductor processes or with different semiconductor wafers.

The first semiconductor wafer WF1 may be stacked on the second semiconductor wafer WF2 and may be electrically connected with the second semiconductor wafer WF2. The second semiconductor wafer WF2 may be stacked on the third semiconductor wafer WF3 and may be electrically connected with the third semiconductor wafer WF3. In other words, the second semiconductor wafer WF2 may be interposed between the first and third semiconductor wafers WF1 and WF3.

The first semiconductor wafer WF1 may include a first pixel circuit area PXCA1 and a first pad area PA1. The first pixel circuit area PXCA1 and the first pad area PA1 may be physically separated from each other or may be spaced from each other by a given distance.

The first pixel circuit area PXCA1 may be an area for forming a part of a plurality of digital pixels DP. For example, as described above, the first pixel circuit area PXCA1 may include a first pixel circuit (e.g., a photo detector or a portion of a comparator) of each of the plurality of digital pixels DP.

The first pad area PA1 may be an area for forming a plurality of pads that are connected with a second pad area PA2 of the second semiconductor wafer WF2. The first pad area PA1 may be connected with components of the first pixel circuit area PXCA1 through a metal layer formed in the first semiconductor wafer WF1.

The second semiconductor wafer WF2 may include a second pixel circuit area PXCA2, the second pad area PA2, a pixel driver area PDA, and a third pad area PA3. The second pixel circuit area PXCA2 may include a second pixel circuit (e.g., a portion of a comparator or the remaining components of a pixel) of each of the plurality of digital pixels DP. In an exemplary embodiment of the inventive concept, the second pixel circuit area PXCA2 may include a memory cell area and a peripheral area described with reference to FIGS. 1 to 15.

In an exemplary embodiment of the inventive concept, a first portion of the comparator formed in the first pixel circuit area PXCA1 of the first semiconductor wafer WF1 and a second portion of the comparator formed in the second pixel circuit area PXCA2 of the second semiconductor wafer WF2 may be bonded through a connection structure formed on a plane corresponding to the first pixel circuit area PXCA1 or the second pixel circuit area PXCA2. In an exemplary embodiment of the inventive concept, the connection structure may be a component, which is configured to bond semiconductor wafers, such as Cu-to-Cu bonding, TSV, or BVS, or a material for bonding the semiconductor wafers.

The pixel driver area PDA may be an area for forming the pixel driver 120 described above. Some analog circuits such as the counter 121, the row driver 122, the ramp generator 123, and the voltage generator 124 described above may be formed in the pixel driver area PDA.

The second pad area PA2 may be an area for forming a plurality of pads that are connected with the first pad area PA1. The plurality of pads of the second pad area PA2 may be respectively connected with the plurality of pads of the first pad area PA1 through a connection structure. In an exemplary embodiment of the inventive concept, the connection structure may be a component, which is configured to bond semiconductor wafers, such as Cu-to-Cu bonding, TSV, or BVS, or a material for bonding the semiconductor wafers.

The third pad area PA3 may be an area for forming a plurality of pads that are connected with the third semiconductor wafer WF3.

In an exemplary embodiment of the inventive concept, various components included in the second pixel circuit area PXCA2, the second pad area PA2, the pixel driver area PDA, and the third pad area PA3 may be connected to each other through a metal layer of the second semiconductor wafer WF2.

The third semiconductor wafer WF3 may include a digital logic circuit area DLA and a fourth pad area PA4. The digital logic circuit area DLA may be an area for forming the digital logic circuit 130 described above. The fourth pad area PA4 may be an area for forming a plurality of pads. The plurality of pads of the fourth pad area PA4 may be respectively connected with the plurality of pads of the third pad area PA3 through a connection structure. In an exemplary embodiment of the inventive concept, the connection structure may be a component, which is configured to bond semiconductor wafers, such as Cu-to-Cu bonding, TSV, or BVS, or a material for bonding the semiconductor wafers.

In an exemplary embodiment of the inventive concept, the first pixel circuit area PXCA1 of the first semiconductor wafer WF1 and the second pixel circuit area PXCA2 of the second semiconductor wafer WF2 may overlap each other in the same plane area, and may be an area for forming a plurality of digital pixels like a pixel core area.

As a peripheral area (or a peripheral circuit area), the remaining areas of the first and second semiconductor wafers WF1 and WF2 other than the first and second pixel circuit areas PXCA1 and PXCA2 may be an area for forming a connection structure between semiconductor wafers, or a driver circuit, an analog circuit, etc. In an exemplary embodiment of the inventive concept, circuits or physical components that operate based on a digital signal in the image sensor device 100 may be formed in the third semiconductor wafer WF3.

As described above, in the image sensor device 100 according to an exemplary embodiment of the inventive concept, the size of a memory cell area may be reduced as a plurality of pixels share one memory cell area. Because a portion of the memory cell area corresponding to the decreased size is used as a peripheral area, the reliability of components included in the peripheral area may be increased, and additional components for any other function of the image sensor device 100 may be further added. Accordingly, an image sensor device with reduced costs, increased reliability, and improved performance is provided.

Figure 17:
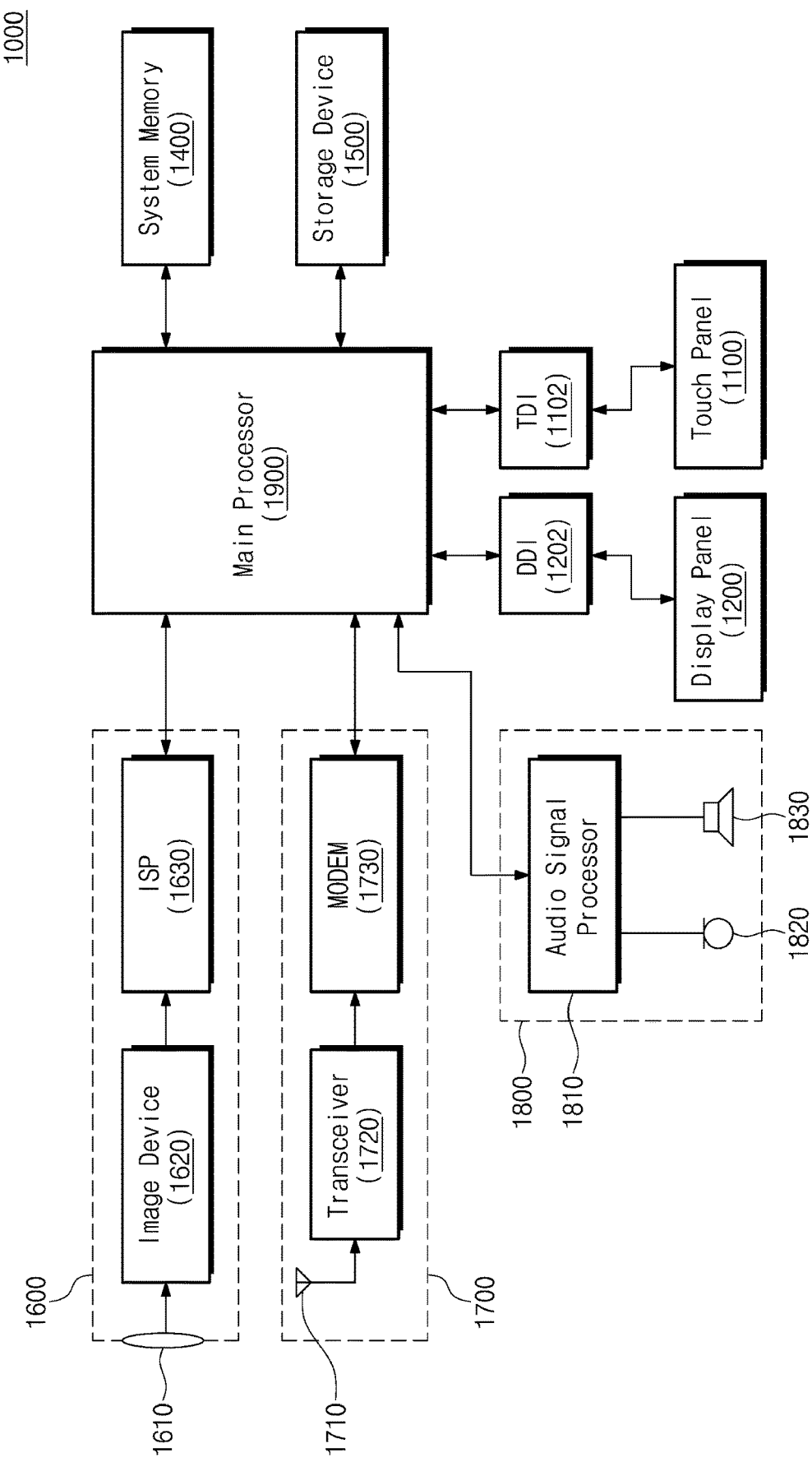
FIG. 17 is a block diagram illustrating an electronic device to which an image sensor device according to an exemplary embodiment of the inventive concept is applied.

FIG. 17 is a block diagram illustrating an electronic device to which an image sensor device according to an exemplary embodiment of the inventive concept is applied. Referring to FIG. 17, an electronic device 1000 may include a touch panel 1100, a touch driver integrated circuit 1102, a display panel 1200, a display driver integrated circuit 1202, a system memory 1400, a storage device 1500, an image processor 1600, a communication block 1700, an audio processor 1800, and a main processor 1900. In an exemplary embodiment of the inventive concept, the electronic device 1000 may be one of various electronic devices such as a portable communication terminal, a personal digital assistant (PDA), a portable media player (PMP), a digital camera, a smartphone, a tablet computer, a laptop computer, and a wearable device.

The touch driver integrated circuit 1102 may be configured to control the touch panel 1100. The touch panel 1100 may be configured to sense a touch input from a user under control of the touch driver integrated circuit 1102. The display driver integrated circuit 1202 may be configured to control the display panel 1200. The display panel 1200 may be configured to display image information under control of the display driver integrated circuit 1202.

The system memory 1400 may store data that are used for an operation of the electronic device 1000. For example, the system memory 1400 may temporarily store data processed or to be processed by the main processor 1900. In an exemplary embodiment of the inventive concept, output data that are provided from an image signal processor 1630 may be stored in the system memory 1400.

The storage device 1500 may store data regardless of whether a power is supplied. For example, the storage device 1500 may include at least one of various nonvolatile memories such as a flash memory, a phase change RAM (PRAM), a magnetoresistive RAM (MRAM), a resistive RAM (ReRAM), and a ferroelectric RAM (FRAM). For example, the storage device 1500 may include an embedded memory and/or a removable memory of the electronic device 1000.

The image processor 1600 may receive a light through a lens 1610. An image device 1620 and the image signal processor 1630 included in the image processor 1600 may generate image information about an external object, based on a received light. In an exemplary embodiment of the inventive concept, the image signal processor 1630 may be an image sensor device described with reference to FIGS. 1 to 16B or may operate based on the methods described with reference to FIGS. 1 to 16B.

The communication block 1700 may exchange signals with an external device/system through an antenna 1710. A transceiver 1720 and a MODEM (e.g., Modulator/Demodulator) 1730 of the communication block 1700 may process signals, which are exchanged with the external device/system, depending on one or more of various wired/wireless communication protocols.

The audio processor 1800 may process an audio signal by using an audio signal processor 1810. The audio processor 1800 may receive an audio input through a microphone 1820 or may provide an audio output through a speaker 1830.

The main processor 1900 may control overall operations of the electronic device 1000. The main processor 1900 may control/manage operations of the components of the electronic device 1000. The main processor 1900 may process various operations for the purpose of operating the electronic device 1000. In an exemplary embodiment of the inventive concept, a part of the components of FIG. 17 may be implemented in the form of a system on chip and may be provided as an application processor (AP) of the electronic device 1000.

According to exemplary embodiments of the inventive concept, digital pixels included in an image sensor device share one memory cell area or one memory cell array. As such, the size of a dummy pattern area or dummy cells necessary to maintain the reliability of memory cells may be decreased, and a portion of the dummy pattern area corresponding to the decreased size may be used as a peripheral area in which other components may be disposed. As the size of the peripheral area increases, the reliability of components formed in the peripheral area may be increased. In addition, other types of components for implementing an additional function of a digital pixel may be further added to the peripheral area. Accordingly, an image sensor device with reduced costs, increased reliability, and improved performance is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An image sensor device, comprising:
    a first digital pixel including a first photo detector and first memory cells configured to store a first digital signal corresponding to a first output from the first photo detector; and
    a second digital pixel including a second photo detector and second memory cells configured to store a second digital signal corresponding to a second output from the second photo detector,
    wherein the second digital pixel is adjacent to one side of the first digital pixel along a first direction,
    wherein the first memory cells and the second memory cells are connected with a plurality of bit lines,
    wherein the first memory cells are connected with a first word line and a third word line,
    wherein the second memory cells are connected with a second word line and a fourth word line,
    wherein the second word line is between the first and third word lines,
    wherein the third word line is between the second and fourth word lines, and
    wherein the first photo detector is formed on a first area in a first semiconductor wafer,
    wherein the second photo detector is formed on a second area in the first semiconductor wafer,
    wherein the first memory cells are formed on a third area in a second semiconductor wafer,
    wherein the second memory cell are formed on a fourth area in the second semiconductor wafer,
    wherein the first semiconductor wafer is stacked on the second semiconductor wafer such that the first area overlaps the third area and the second area overlaps the fourth area.

2. The image sensor device of claim 1, wherein the first word line is electrically connected with a first word line contact and the third word line is electrically connected with a third word line contact, wherein the first and third word line contacts are on one side of the first memory cells, and
    wherein the second word line is electrically connected with a second word line contact and the fourth word line is electrically connected with a fourth word line contact, Wherein the second and fourth word line contacts are on one side of the second memory cells, which is opposite the one side of the first memory cells.

3. The image sensor device of claim 2, wherein each of a first distance between the first a d third word line contacts and a second distance between the second and fourth word line contacts is greater than each of a distance between the first and second word lines, a distance between the second and third word lines, and a distance between the third and fourth word lines.

4. The image sensor device of claim 1, further comprising:
    a third digital pixel including a third photo detector and third memory cells configured to store a third digital signal corresponding to a third output from the third photo detector, the third digital pixel being adjacent to one side of the first digital pixel along a second direction; and
    a fourth digital pixel including a fourth photo detector and fourth memory cells configured to store a fourth digital signal corresponding to a fourth output from the fourth photo detector, the fourth digital pixel being adjacent to one side of the second digital pixel along the second direction,
    wherein the third memory cells and the fourth memory cells are connected with the plurality of bit lines, wherein the third memory cells are connected with a fifth word line and a seventh word line, and the fourth memory cells are connected with a sixth word line and an eighth word line, and wherein the fifth word line is between the fourth and sixth word lines, the seventh word line is between the sixth and eighth word lines, and the sixth word line is between the fifth and seventh word lines.

5. The image sensor device of claim 4, wherein the fifth word line is electrically connected with a fifth word line contact and the seventh word line is electrically connected with a seventh word line contact, wherein the fifth and seventh word line contacts are on one side of the third memory cells, and wherein the sixth word line is electrically connected with a sixth word line contact and an eighth word line is electrically connected with an eighth word line contact, wherein the sixth and eighth word line contacts are on one side of the fourth memory cells.

6. The image sensor device of claim 4, wherein the first memory cells, the second memory cells, the third memory cells, and the fourth memory cells are included in a single memory cell array, and wherein the single memory cell array further includes:
a first dummy pattern area on one side of the first word line, wherein the first dummy pattern area extends along the first direction;
a second dummy pattern area on one side of the eighth word line, Wherein the second dummy pattern area extends along the first direction;
a third dummy pattern area on one side of the first t© fourth memory cells, wherein the third dummy pattern area extends along the second direction; and
a fourth dummy pattern area on one side of the first to fourth memory cells, wherein the fourth dummy pattern are extends along the second direction, the fourth dummy pattern area and the third dummy pattern area being opposite each other.

7. The image sensor device of claim 6, wherein the single memory cell array further includes:
a shared dummy pattern area between the fourth word line and the fifth word line.

8. The image sensor device of claim 1, further comprising:
a counter configured to provide a digital code to the plurality of bit lines;
a row driver configured to output first and second photo detector control signals for controlling the first photo detector and the second photo detector and first and second memory control signals for controlling the first memory cells and the second memory cells; and
a ramp generator configured to generate a ramp signal,
wherein the first photo detector is configured to output the first output in response to the first photo detector control signal, and
wherein the second photo detector is configured to output the second output in response to the second photo detector control signal.

9. The image sensor device of claim 8, wherein the first digital pixel further includes a first comparator configured to compare the first output from the first photo detector with the ramp signal and to output a first comparison signal, and
wherein the second digital pixel further includes a second comparator configured to compare the second output from the second photo detector with the ramp signal and to output a second comparison signal.

10. The image sensor device of claim 9, wherein the first memory cells are configured to store, as the first digital signal, the digital code provided through the plurality of bit lines, in response to the first memory control signal and the first comparison signal, and wherein the second memory cells are configured to store, as the second digital signal, the digital code provided through the plurality of bit lines, in response to the second memory control signal and the second comparison signal.

11. The image sensor device of claim 8, further comprising:
a shared comparator configured to:
compare the first output from the first photo detector and the ramp signal to output a first comparison signal; and
compare the second output from the second photo detector and the ramp signal to output a second comparison signal.

12. The image sensor device of claim 1, wherein the first photo detector includes a plurality of first photo diodes configured to detect a light of a first color incident from outside the image sensor, and wherein the second photo detector includes a plurality of second photo diodes configured to detect a light of a second color incident from the outside.

13. An image sensor device, comprising:
a first digital pixel including a first photo detector and first memory cells configured to store a first digital signal corresponding to a first output from the first photo detector; and
a second digital pixel including a second photo detector and second memory cells configured to store a second digital signal corresponding to a second output from the second photo detector,
wherein the second digital pixel is adjacent to a first side of the first digital pixel along a first direction,
wherein the first memory cells and the second memory cells are formed on a first semiconductor wafer,
wherein the first semiconductor wafer includes:
a first area including the first memory cells;
a second area including the second memory cells, wherein the second area is adjacent to the first area along the first direction;
a first shared dummy pattern area between a first side of the first area and a first side of the second area;
a first dummy pattern area adjacent to a second side of the first area, which is opposite the first side of the first area; and
a second dummy pattern area adjacent to a second side of the second area, which is opposite the first side of the second area, and
wherein a first width of the first shared dummy pattern area in the first direction is smaller than two times a second width of the first dummy pattern area in the first direction or two times a third width of the second dummy pattern area in the second direction.

14. The image sensor device of claim 13, wherein the first memory cells are connected with first hit lines and first word lines, and the second memory cells are connected with second bit lines and second word lines.

15. The image sensor device of claim 14, wherein at least one of the first memory cells and at least one of the second memory cells are in the same row, and wherein the shared dummy pattern area includes at least one isolation dummy cell which is in the same row as the at least one of the first memory cells and the at least one of the second memory cells and is not connected with the first word lines and the second word lines.

16. The image sensor device of claim 13, further comprising:
- a third digital pixel including a third photo detector and third memory cells configured to store a third digital signal corresponding to a third output from the third photo detector, the third digital pixel being adjacent to a second side of the first digital pixel along a second direction; and
- a fourth digital pixel including a fourth photo detector and fourth memory cells configured to store a fourth digital signal corresponding to a fourth output from the fourth photo detector, the fourth digital pixel being adjacent to a second side of the second digital pixel along the second direction,
- wherein the third memory cells and the fourth memory cells are formed on the first semiconductor wafer,
- wherein the first semiconductor wafer further includes:
- a third area including the third memory cells and adjacent to the first area along the second direction;
- a fourth area including the fourth memory cells and adjacent to the third area along the first direction;
- a second shared dummy pattern area between a first side of the third area and a first side of the fourth area;
- a third dummy pattern area adjacent to a second side of the third area, which is opposite to the first side of the third area; and
- a fourth dummy pattern area adjacent to a second side of the fourth area, which is opposite to the first side of the fourth area, and
- wherein a fourth width of the second shared dummy pattern area in the first direction is smaller than two times a fifth width of the third dummy pattern area in the first direction or two times a sixth width of the fourth dummy pattern area in the first direction.

17. The image sensor device of claim 16, wherein the first semiconductor wafer further includes:
- a fifth dummy pattern area on one side of the first and second areas;
- a sixth dummy pattern area on one side of the third and fourth areas, wherein the fifth and sixth dummy pattern areas are opposite each other; and
- a third shared dummy pattern area between the first and second areas and the third and fourth areas, and
- wherein a seventh width of the third shared dummy pattern area in the second direction is smaller than two times an eighth width of the fifth dummy pattern area in the second direction or two times a ninth width of the sixth dummy pattern area in the second direction.

18. The image sensor device of claim 16, wherein the first photo detector, the second photo detector, the third photo detector, and the fourth photo detector are formed at a second semiconductor wafer, and
- wherein the first semiconductor wafer is stacked on the second semiconductor wafer such that an area where the first photo detector is formed and the first area overlap each other, an area where the second photo detector is formed and the second area overlap each other, an area where the third photo detector is formed and the third area overlap each other, and an area Where the fourth photo detector is formed and the fourth area overlap each other.

19. An image sensor device, comprising:
- a first digital pixel including a first photo detector and first memory cells configured to store a first digital signal corresponding to a first detection signal from the first photo detector; and
- a second digital pixel including a second photo detector and second memory cells configured to store a second digital signal corresponding to a second detection signal from the second photo detector,
- wherein the second digital pixel is adjacent to the first digital pixel along a first direction,
- wherein the first memory cells and the second memory cells are included in a single memory cell array,
- wherein the first photo detector and the second photo detector are formed on a first area in a first semiconductor wafer,
- Wherein the single memory cell array is formed on a second area in a second semiconductor wafer, and
- wherein the first semiconductor wafer is stacked on the second semiconductor wafer such that the first photo detector and the second photo detector overlap the single memory cell array in a second direction perpendicular to the first direction.

20. The image sensor device of claim 19, wherein the first memory cells are connected with a first word line and a plurality of hit lines, and
- wherein the second memory cells are connected with a second word line and the plurality of bit lines.

21. An image sensor device, comprising:
- a first digital pixel including a first photo detector and first memory cells configured to store a first digital signal corresponding to a first detection signal from the first photo detector; and
- a second digital pixel including a second photo detector and second memory cells configured to store a second digital signal corresponding to a second detection signal from the second photo detector,
- wherein the second digital pixel is adjacent to the first digital pixel along a first direction,
- wherein dummy memory cells are disposed between the first and second memory cells, and
- wherein the dummy memory cells, the first memory cells, and the second memory cells are included in a single memory cell array.

22. The image sensor device of claim 21, wherein the dummy memory cells are included in a shared dummy pattern area that extends lengthwise in a second direction perpendicular to the first direction.

* * * * *